United States Patent
Kim et al.

(10) Patent No.: US 10,216,422 B2
(45) Date of Patent: Feb. 26, 2019

(54) STORAGE DEVICE INCLUDING NONVOLATILE MEMORY DEVICE AND ACCESS METHOD FOR NONVOLATILE MEMORY DEVICE

(71) Applicants: Chanha Kim, Hwaseong-si (KR); Hyunkyo Oh, Yongin-si (KR); Oak-Ha Kim, Yongin-si (KR); Seungkyung Ro, Anyang-si (KR); Jong-Nam Baek, Hwaseong-si (KR); Donggi Lee, Yongin-si (KR); Jinwook Lee, Seoul (KR); Heewon Lee, Suwon-si (KR)

(72) Inventors: Chanha Kim, Hwaseong-si (KR); Hyunkyo Oh, Yongin-si (KR); Oak-Ha Kim, Yongin-si (KR); Seungkyung Ro, Anyang-si (KR); Jong-Nam Baek, Hwaseong-si (KR); Donggi Lee, Yongin-si (KR); Jinwook Lee, Seoul (KR); Heewon Lee, Suwon-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 39 days.

(21) Appl. No.: 15/634,100

(22) Filed: Jun. 27, 2017

(65) Prior Publication Data
US 2018/0143762 A1    May 24, 2018

(30) Foreign Application Priority Data
Nov. 24, 2016    (KR) .................. 10-2016-0157445

(51) Int. Cl.
*G06F 12/00*    (2006.01)
*G06F 3/06*    (2006.01)
(Continued)

(52) U.S. Cl.
CPC ............ *G06F 3/061* (2013.01); *G06F 3/0614* (2013.01); *G06F 3/0652* (2013.01);
(Continued)

(58) Field of Classification Search
CPC ...... G06F 3/061; G06F 3/0614; G06F 3/0652; G06F 3/0656; G06F 3/0679;
(Continued)

(56) References Cited

U.S. PATENT DOCUMENTS

| 6,294,926 B1 | 9/2001 | Cline |
| 6,539,368 B1 | 3/2003 | Chernikov et al. |

(Continued)

FOREIGN PATENT DOCUMENTS

KR    2015/0099218 A    8/2015

*Primary Examiner* — Shawn X Gu
(74) *Attorney, Agent, or Firm* — Harness, Dickey & Pierce, P.L.C.

(57) ABSTRACT

A storage device includes a nonvolatile memory device, a buffer memory, a controller and a neuromorphic chip. The neuromorphic chip is configured to generate an access classifier based on the access result information and the access environment information. The controller is configured to perform first accesses to the nonvolatile memory device using the buffer memory and to collects the access result information and the access environment information of the first accesses in the buffer memory. The controller is configured to perform a second access of the nonvolatile memory device using the buffer memory. The controller is configured to obtain a prediction result of access parameters associated with the second access by using access environment information associated with the second access and the access classifier.

20 Claims, 24 Drawing Sheets

(51) Int. Cl.
  *G06N 3/04*    (2006.01)
  *G06N 5/04*    (2006.01)
  *G06N 99/00*   (2010.01)
  *G06F 12/02*   (2006.01)
  *G06N 3/063*   (2006.01)

(52) U.S. Cl.
  CPC .......... *G06F 3/0656* (2013.01); *G06F 3/0679* (2013.01); *G06F 12/0238* (2013.01); *G06F 12/0246* (2013.01); *G06N 3/04* (2013.01); *G06N 3/063* (2013.01); *G06N 5/04* (2013.01); *G06N 99/005* (2013.01)

(58) Field of Classification Search
  CPC ... G06F 12/0238; G06F 12/0246; G06N 3/04; G06N 3/063; G06N 5/04; G06N 99/005

See application file for complete search history.

(56) References Cited

U.S. PATENT DOCUMENTS

| | | |
|---|---|---|
| 7,679,133 B2 | 3/2010 | Son et al. |
| 8,209,504 B2 | 6/2012 | Nakanishi et al. |
| 8,327,066 B2 | 12/2012 | Heo et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,111,222 B2 | 8/2015 | Aparin |
| 9,256,371 B2 | 2/2016 | Franceschini et al. |
| RE45,954 E | 3/2016 | Hemink et al. |
| 9,535,620 B2 | 1/2017 | Kim et al. |
| 2011/0233648 A1 | 9/2011 | Seol et al. |
| 2015/0324691 A1 | 11/2015 | Dropps et al. |
| 2016/0075016 A1 | 3/2016 | Laurent et al. |
| 2016/0117121 A1 | 4/2016 | Bohn et al. |
| 2016/0132256 A1 | 5/2016 | Jung |
| 2017/0154259 A1* | 6/2017 | Burr ........................ G06N 3/08 |

* cited by examiner

FIG. 7

| Access Result Information | – Whether number of on cells for VR1 is greater than threshold value<br>– Whether number of off cells for VR2 is greater than threshold value |
|---|---|
| Access Environment Information | – Target block<br>– Target SSL<br>– Target WL (Height)<br>– Temperature<br>– Time stamp<br>– P/E cycle<br>– Read count |

FIG. 9

| Access Result Information | - Read level<br>- Read pass level<br>- Whether to perform soft decision<br>- BER<br>- Program start level<br>- Program increment level<br>- Program pass level<br>- Number of program loops<br>- Erase start level<br>- Erase increment level<br>- Number of erase loops |
|---|---|
| Access Environment Information | - Target block<br>- Target SSL<br>- Target WL (Height)<br>- Target logical page<br>- Temperature<br>- Time stamp<br>- P/E cycle<br>- Read count |

FIG. 11

| Access Result Information | – Whether number of dummy cells/selection transistors outside RNG is greater than threshold value |
|---|---|
| Access Environment Information | – Target block<br>– Target SSL/GSL<br>– Target WL (DMC)<br>– Temperature<br>– Time stamp<br>– P/E cycle<br>– Read count |

FIG. 13

| Access Result Information | - Whether BER is greater than threshold value |
|---|---|
| Access Environment Information | - Target block<br>- Target SSL<br>- Target WL (Height)<br>- Temperature<br>- Time stamp<br>- P/E cycle<br>- Read count<br>- Number of on cells for VR1<br>- Number of off cells for VR2 |

FIG. 15

| Regarding Read Operation | - Read level<br>- Read pass level<br>- Whether to perform soft decision<br>- Whether to schedule read reclaim |
|---|---|
| Regarding Program Operation | - Program start level<br>- Program pass level<br>- Program increment level<br>- Program verification level<br>- Whether to perform optional encoding |
| Regarding Erase Operation | - Erase start level<br>- Erase increment level<br>- Erase verification level |
| Regarding General Operation | - Whether to schedule garbage collection<br>- Whether to schedule wear leveling<br>- Whether to schedule bad block process<br>- Whether to schedule reliability verification read<br>- Whether to schedule AI read |

FIG. 16

| | |
|---|---|
| General Information | - Program time (e.g., number of program pulses, number of passed cells, amount of program charges, etc.)<br>- Erase time (e.g., number of erase pulses, number of passed cells, amount of erase charges, etc.)<br>- Number of read iterations<br>- Number of errors<br>- Physical location<br>- Locations of bad blocks<br>- Error correction time |
| Distribution Information | - Valley level<br>- Peak Level<br>- Slope between valley level and peak level |
| Degradation Information | - P/E cycle<br>- Read count<br>- Time after program (e.g., time stamp)<br>- Total number of pulses (e.g., program/erase pulses or read count)<br>- Level of voltage (e.g., max (or average) level of program/read/erase) |
| Logical Information | - Hot/Warm/Cold (e.g., program/read frequency)<br>- Map data update |

FIG. 17

| Access Environment Information | – Temperature<br>– Humidity<br>– Access target |

STORAGE DEVICE INCLUDING NONVOLATILE MEMORY DEVICE AND ACCESS METHOD FOR NONVOLATILE MEMORY DEVICE

CROSS-REFERENCE TO RELATED APPLICATIONS

A claim for priority under 35 U.S.C. § 119 is made to Korean Patent Application Nos. 10-2016-0157445 filed Nov. 24, 2016, in the Korean Intellectual Property Office, the entire contents of which are hereby incorporated by reference.

BACKGROUND

Inventive concepts disclosed herein relate to a semiconductor circuit, and more particularly, to a storage device including a nonvolatile memory device and an access method for the nonvolatile memory device.

A storage device includes a nonvolatile memory. Since the storage device retains data stored therein even at power-off, the storage device may store data for long time. The storage device may be used as main storage in various electronic devices such as a computer, a smartphone, and a smart pad.

A pattern of performing data reading and writing on storage devices may vary according to data usage patterns of users and environments in which data is used. The operating performance of the storage devices may vary if the pattern of performing data reading and writing on the storage devices varies.

Manufacturers of the storage devices set an algorithm for internal operations (e.g., write and read operations) thereof based on average usage patterns and use environments. If the average usage patterns and use environments are applied to the storage devices, the storage devices fail to provide optimum operating performance on each user.

SUMMARY

Some example embodiments of inventive concepts provide a storage device and an access method for a nonvolatile memory device that provide a desired (and/or optimum) operating performance to each user.

According to some example embodiments of inventive concepts, a storage device includes a nonvolatile memory device, a buffer memory, a neuromorphic chip, and a controller. The neuromorphic chip is configured to generate an access classifier based on access result information and access environment information. The controller is configured to perform first accesses to the nonvolatile memory device using the buffer memory. The controller is configured to collect the access result information and the access environment information of the first accesses in the buffer memory. The controller is configured to perform a second access of the nonvolatile memory device using the buffer memory. The controller is configured to obtain a prediction result of access parameters associated with the second access by using access environment information associated with the second access and the access classifier.

According to some example embodiments of inventive concepts, a storage device includes a nonvolatile memory device, a buffer memory, and a controller. The controller may be configured to perform first accesses to the nonvolatile memory device using the buffer memory. The controller may be configured to collect access result information and access environment information of the first accesses in the buffer memory, and the controller may be configured to generate an access classifier by performing machine learning based on the access result information and the access environment information collected in the buffer memory. The controller may be configured to perform a second access of the nonvolatile memory device using the buffer memory. The controller may be configured to obtain a prediction result of access parameters associated with the second access by using access environment information associated with the second access and the access classifier.

According to some example embodiments of inventive concepts, an access method of a nonvolatile memory device includes performing first access to the nonvolatile memory device to collect first access result information and first access environment information of the first accesses, generating an access classifier by performing machine learning based on the collected first access result information and the collected first access environment information, obtaining, before performing a second access on the nonvolatile memory device, a prediction result of access parameters associated with the second access by using second access environment information of the second access and the access classifier, performing the second access on the nonvolatile memory device by using the prediction result, and updating the access classifier such that second access result information of the second access and the second access environment information of the second access are applied to the access classifier.

According to some example embodiments, a controller includes a buffer memory and a first core. The first core may be configured to communicate with an external host, the buffer memory, and a nonvolatile memory device. The first core may be configured to perform a first access on the nonvolatile memory device using the buffer memory. The first core may be configured to receive a prediction result of access parameters associated with a second access before performing the second access on the nonvolatile memory device using the buffer memory. The prediction result may be based on access environment information associated with the second access and an access classifier associated with the first access. The access classifier associated with the first access may be based on access result information and access environment information collected from the nonvolatile memory device after the first access. The first core may be configured to perform a first operation of the second access on the nonvolatile memory device using the buffer memory or a second operation of the second access on the nonvolatile memory device using the buffer memory based on the prediction result. The second operation of the second access may be different than the first operation of the first access.

BRIEF DESCRIPTION OF THE FIGURES

The above and other effects and features will become apparent from the following description with reference to the following figures, wherein like reference numerals refer to like parts throughout the various figures unless otherwise specified, and wherein:

FIG. 7 shows an example of access result information and access environment information when machine learning is applied to a reliability verification read operation;

FIG. 9 shows an example of the access result information and the access environment information when machine learning is applied to a read operation, a write operation, or an erase operation;

FIG. 11 shows an example of the access result information and the access environment information when machine learning is applied to a check operation;

FIG. 13 shows an example in which results of access operations are classified by using a result of a sub access operation as the access environment information;

FIG. 15 shows an application of the access result information;

FIG. 16 shows another application of the access result information;

FIG. 17 shows an application of the access environment information;

DETAILED DESCRIPTION

Below, some example embodiments of inventive concepts will be described more fully with reference to accompanying drawings so that this disclosure will be thorough and complete, and will fully convey the scope of inventive concepts to those of ordinary skill in the art.

Figure 1:
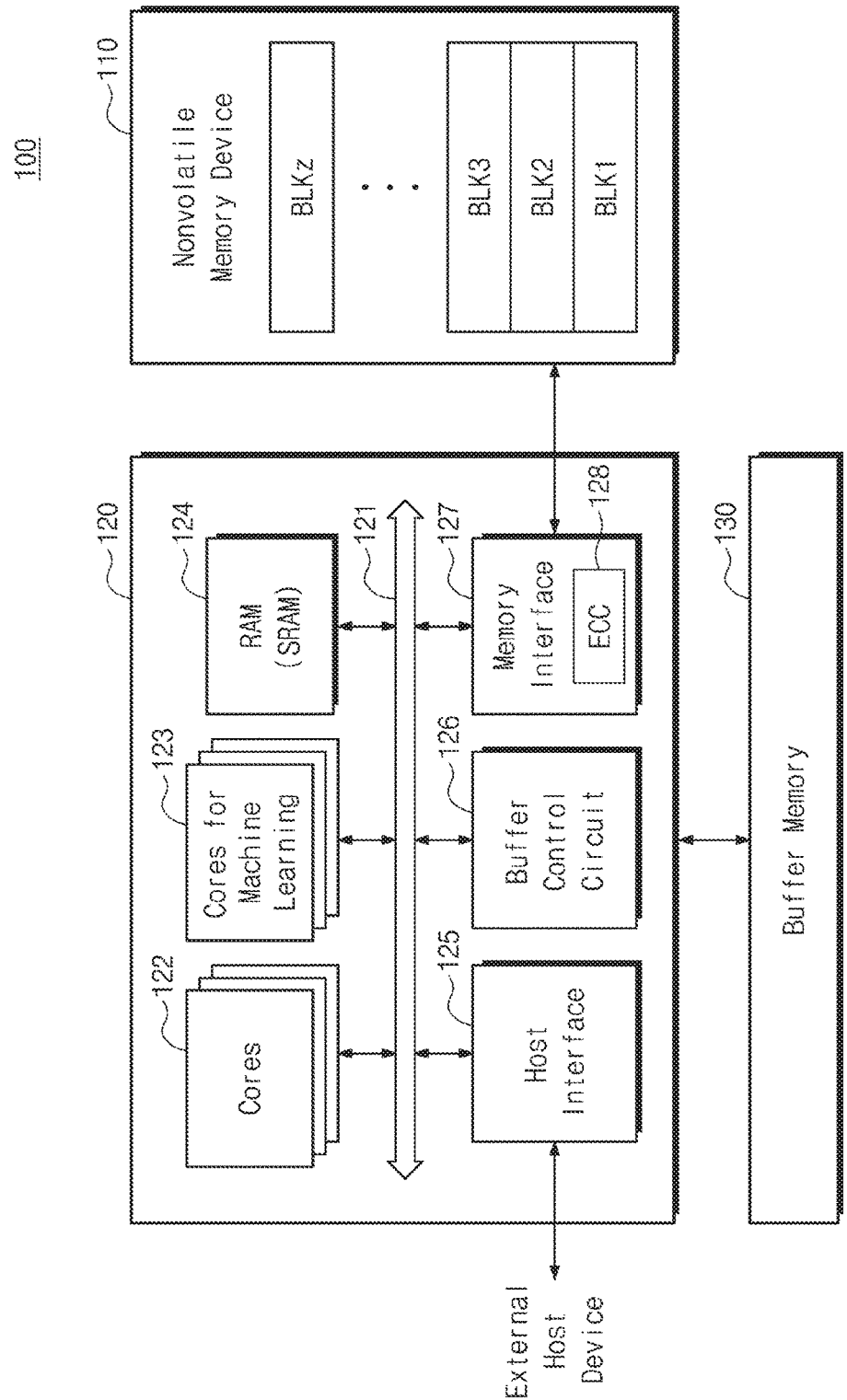
FIG. 1 is a block diagram illustrating a storage device, according to some example embodiments of inventive concepts.

FIG. 1 is a block diagram illustrating a storage device 100, according to some example embodiments of inventive concepts. Referring to FIG. 1, the storage device 100 includes a nonvolatile memory device 110, a controller 120, and a buffer memory 130.

The nonvolatile memory device 110 may perform a write operation, a read operation, and an erase operation under control of the controller 120. The nonvolatile memory device 110 may receive a write command, an address, and data from the controller 120 and may write the data in a storage space corresponding to the address. The nonvolatile memory device 110 may receive a read command and an address from the controller 120, may read data from a storage space corresponding to the address, and may output the read data to the controller 120. The nonvolatile memory device 110 may receive an erase command and an address from the controller 120 and may erase data of a storage space corresponding to the address.

The nonvolatile memory device 110 may include a plurality of memory blocks BLK1 to BLKz. Each of the memory blocks BLK1 to BLKz may include a plurality of memory cells. The memory cells may form a storage space of the nonvolatile memory device 110. Each of the memory blocks BLK1 to BLKz may further include selection transistors that allow memory cells to be selected independently of each other. The memory blocks BLK1 to BLKz may be distinguished according to an operational characteristic or a structural characteristic of the nonvolatile memory device 110.

The nonvolatile memory device 110 may include a flash memory, a phase-change random access memory (PRAM), a ferroelectric RAM (FeRAM), a magnetic RAM (MRAM), a resistive RAM (RRAM), etc.

The controller 120 may access the nonvolatile memory device 110 and the buffer memory 130. The controller 120 may perform a write operation, a read operation, and an erase operation in response to a request of an external host device (not illustrated). The controller 120 may write write-requested data in the nonvolatile memory device 110 and may read and output read-requested data from the nonvolatile memory device 110.

The controller 120 may manage the storage device 100 by using the buffer memory 130. For example, the controller 120 may temporarily store data to be written in the nonvolatile memory device 110 or data read from the nonvolatile memory device 110 in the buffer memory 130. The controller 120 may load metadata, which is needed to manage the nonvolatile memory device 110, on the buffer memory 130.

The controller 120 may collect access environment information and access result information upon accessing the nonvolatile memory device 110. For example, the access environment information and the access result information may be collected in the buffer memory 130. The controller 120 may perform machine learning based on the access environment information and the access result information collected in the buffer memory 130. For example, the controller 120 may perform machine learning based on access environment information and access result information that are associated with two or more accesses. The controller 120 may select a next access method, whether or not of execution, and access parameters based on the result of the machine learning.

The controller 120 includes a bus 121, cores 122 and 123, a RAM 124, a host interface 125, a buffer control circuit 126, and a memory interface 127.

The bus 121 is configured to provide a channel among elements of the controller 120.

Some cores 122 of the cores 122 and 123 may be used (or assigned or specified) to manage the storage device 100, and the other cores 123 thereof may be used (or assigned or specified) to perform the machine learning.

The cores 122 may control overall operations of the controller 120 and may execute a logical operation. The cores 122 may communicate with the external host device through the host interface 125, may communicate with the nonvolatile memory device 110 through the memory interface 127, and may communicate with the buffer memory 130 through the buffer control circuit 126. The cores 122 may control the storage device 100 by using the RAM 124 as a working memory, a cache memory, or a buffer memory. The cores 122 may request the cores 123 to predict a result associated with at least some of accesses requested by the external host device or accesses made by an internal policy. The cores 122 may select whether or not of execution, a way to perform, processes of execution, and execution parameters of the at least some accesses based on a prediction result received from the cores 123. The cores 122 may be referred to as the first core(s). The cores 123 may be referred to as the second core(s).

The cores 123 may perform machine learning based on access environment information and access result information stored in the buffer memory 130. For example, the cores 123 may generate (or update) learning results, such as decision tree, neural network, and support vector machine, as an access classifier by performing machine learning. The cores 123 may load the access classifier on the RAM 124 or the buffer memory 130 for driving. After access classifiers are generated, the cores 123 may predict results, which are associated with at least some accesses, by using the access classifiers in response to a request of the cores 122. The cores 123 may transfer the prediction result to the cores 122. The cores 123 may write access classifiers in the nonvolatile memory device 110 periodically or when power-off of the storage device 100 is sensed. For example, access classifiers may be written in a memory block, which is set to store metadata information, of the memory blocks BLK1 to BLKz. When electric power is supplied to the storage device 100, the cores 123 may read access classifiers from the nonvolatile memory device 110 and may load the read access classifiers on the buffer memory 130 or the RAM 124.

The RAM 124 may be used as a working memory, a cache memory, or a buffer memory of the cores 122 and 123. The RAM 124 may store codes or commands that the cores 122 and 123 will execute. The RAM 124 may store data processed by the cores 122 and 123. The RAM 124 may include a static RAM (SRAM). The cores 122 and 123 may each respectively include a hardware processor, an application specific integrated circuit (ASIC), and/or another suitable hardware processing unit, that when executing codes or commands and/or processing data stored in the RAM, respectively configure the cores 122 and 123 as special-purpose processors for controlling one or more operations of the cores 122 and 123, respectively. Thus, the cores 122 and 123 may configure the controller 120 as a special-purpose controller for controlling one or more operations of the controller 120 discussed herein.

The host interface 125 may configured to communicate with the external host device under control of the cores 122. The host interface 125 may be configured to convey communications by using at least one of various communication manners, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer control circuit 126 may control the buffer memory 130 under control of the cores 122.

The memory interface 127 may configured to communicate with the nonvolatile memory device 110 in response to control of the cores 122. As described with reference to FIG. 1, the memory interface 127 may convey a command, an address, and data to the nonvolatile memory package 110 through the input/output channel. The memory interface 127 may convey a control signal to the nonvolatile memory device 110 through the control channel.

The memory interface 127 may include an error correction block 128. The error correction block 128 may include an error correction code ECC. The error correction block 128 may perform error correction. The error correction block 128 may perform error correction encoding based on data to be written in the nonvolatile memory device 110 through the memory interface 127. The error correction encoded data may be provided to the nonvolatile memory device 110 through the memory interface 127. The error correction block 128 may perform error correction decoding on data received through the memory interface 127 from the nonvolatile memory device 110.

In some example embodiments, in the case where the storage device 100 does not include the buffer memory 130, the controller 120 may not include the buffer control circuit 126.

Figure 2:
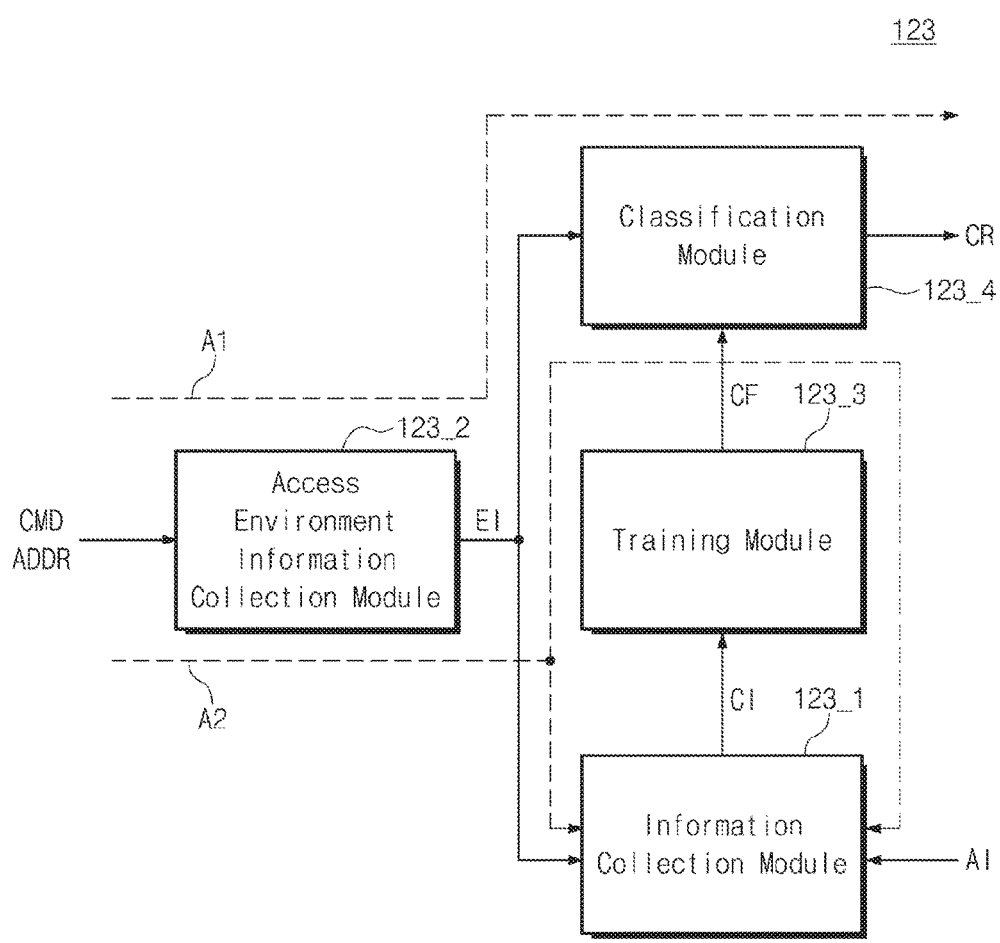
FIG. 2 shows an example of modules implemented by cores for machine learning of FIG. 1.

FIG. 2 shows an example of modules implemented by the cores 123 for machine learning of FIG. 1. Referring to FIGS. 1 and 2, the cores 123 includes an information collection module 123_1, an access environment information collection module 123_2, a training module 123_3, and a classification module 123_4.

The information collection module 123_1 may collect access result information AI that is generated when the controller 120 accesses the nonvolatile memory device 110. For example, the information collection module 123_1 may collect the access result information AI that is associated with accesses, the kind of which is specified by the cores 122 or 123, of various accesses to the nonvolatile memory device 110. Also, pieces of result information, the kind of which is specified by the cores 122 or 123, of various pieces of result information generated by respective accesses may be collected as the access result information AI. Also, the information collection module 123_1 may collect access environment information EI that is associated with accesses of a specified kind. The collected access result information AI may be stored in the buffer memory 130.

The access environment information collection module 123_2 may receive a command CMD or an address ADDR that is associated with an access, the kind of which is specified by the cores 122 or 123, of accesses processed by the cores 122. The access environment information collection module 123_2 may collect the access environment information EI based on the command CMD or the address ADDR. The collected access environment information EI may be transferred to the information collection module 123_1 and the classification module 123_4.

The training module 123_3 may perform machine learning when the collected access environment information EI and the collected access result information AI reach a training condition. As the result of the machine learning, the training mode 123_3 may generate an access classifier CF newly or may update a previous access classifier CF. The new access classifier CF may be stored in the buffer memory 130 or the RAM 124 and may transfer the authority to control the new access classifier CF to the classification module 123_4. In some example embodiments, the access classifier CF is called a "classifier" in terms of predicting a result corresponding to a classified access, and functions and features of the access classifier CF may not be limited by the term "classifier".

The classification module 123_4 may receive the environment information EI from the access environment information collection module 123_2. The classification module 123_4 may output a classification result CR based on the environment information EI and the access classifier CF. The classification result CR may be transferred to the cores 122.

In FIG. 2, two examples in which pieces of information are processed by the modules 123_1 to 123_4 are illustrated by first and second arrows A1 and A2.

Referring to the first arrow A1, result prediction of a specific access may be requested from the cores 122. The access environment information collection module 123_2 may collect the environment information EI. The classification module 123_4 may obtain the classification result CR by using the environment information EI and the access classifier CF. The classification result CR may be transferred to the cores 122. If it the cores 122 determine not to perform an access based on the classification result CR, the access result information AI may not be collected. Accordingly, the access environment information EI may not be collected by the information collection module 123_1 as well.

Referring to the second arrow A2, result prediction of a specific access may be requested from the cores 122. The access environment information collection module 123_2 may collect the environment information EI. The classification module 123_4 may obtain the classification result CR by using the environment information EI and the access classifier CF. The classification result CR may be transferred to the cores 122. If the cores 122 determine to perform an access based on the classification result CR, the access result information AI may be collected. Accordingly, the information collection module 123_2 may collect the access environment information EI and the access result information AI.

Figure 3:
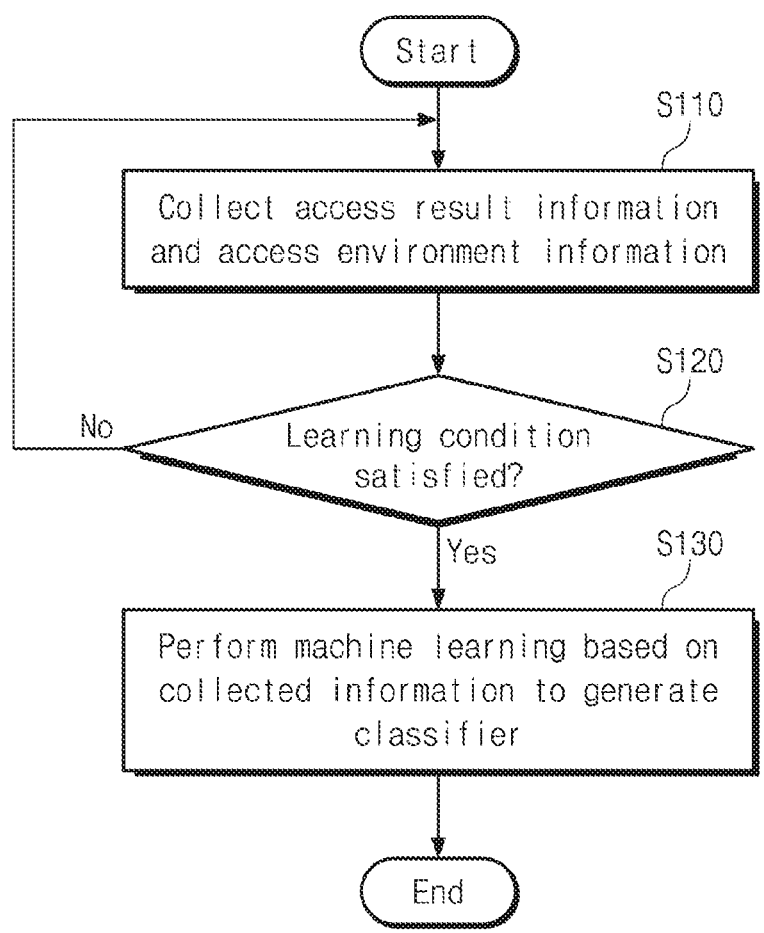
FIG. 3 is a flowchart illustrating an operating method of a storage device, according to some example embodiments of inventive concepts.

FIG. 3 is a flowchart illustrating an operating method of the storage device 100, according to some example embodiments of inventive concepts. Referring to FIGS. 1 to 3, in operation S110, the information collection module 123_1 may collect the access result information AI and the access environment information EI of an access to the nonvolatile memory device 110 together with the access environment information collection module 123_2. The access may include a write operation, a read operation, or an erase operation.

In operation S120, the training mode 123_3 determines whether a learning condition is satisfied. For example, the learning condition may be satisfied when a desired (and/or alternatively predetermined) time period comes, when the size of the collected access result information AI and the collected access environment information EI reaches a desired (and/or alternatively predetermined) size, when it is an idle time (or when an idle time comes), when power-off is sensed, and/or when a storage capacity of a buffer memory is insufficient. If the learning condition is not satisfied, the process proceeds to operation S110 to continue to collect information CI (see FIG. 2). If the learning condition is satisfied, the process proceeds to operation S130.

In operation S130, the training mode 123_3 may perform machine learning based on the collected access result information AI and the collected access environment information EI to generate the access classifier CF. For example, the training module 123_3 may update a previous access classifier with a new access classifier CF by generating a new access classifier CF or changing a parameter such as a weight of a previous access classifier.

Figure 4:
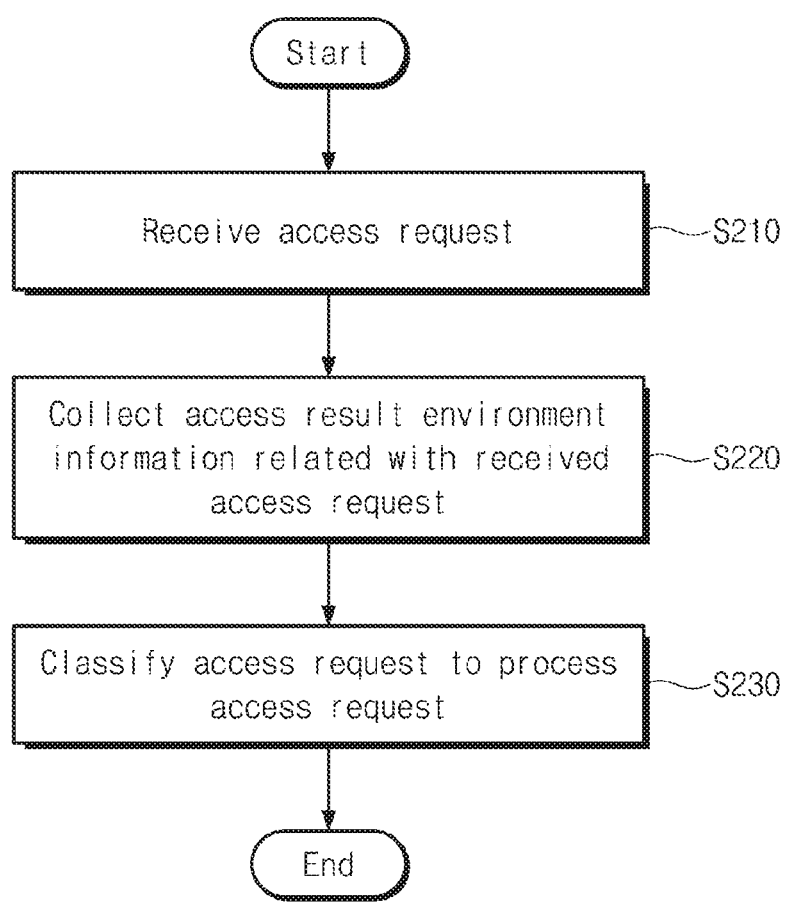
FIG. 4 shows an example in which the storage device predicts (or classifies) an access result of a new access request by using an access classifier, according to some example embodiments of inventive concepts.

FIG. 4 shows an example in which the storage device 100 predicts (or classifies) an access result of a new access request by using an access classifier, according to some example embodiments of inventive concepts. Referring to FIGS. 1, 2, and 4, in operation S210, the cores 122 may receive an access request from an external host device or may generate an access request based on an internal policy. Before the cores 122 perform an access in response to the access request, the cores 122 may request the cores 123 to predict an access result. For example, the access environment information collection module 123_2 may receive the access request including the command CMD and the address ADDR.

In operation S220, the access environment information collection module 123_2 may collect the access environment information EI that is associated with the received access request.

In operation S230, the classification module 123_4 may obtain the classification result CR by using the access environment information EI and the access classifier CF. The cores 122 may process the access request based on the classification result CR. For example, the cores 122 may determine whether to perform an access, based on the classification result CR. Also, when the cores 122 performs an access, the cores 122 may select (or change) various parameters such as voltages used in the nonvolatile memory device 110 and times, based on the classification result CR.

Figure 5:
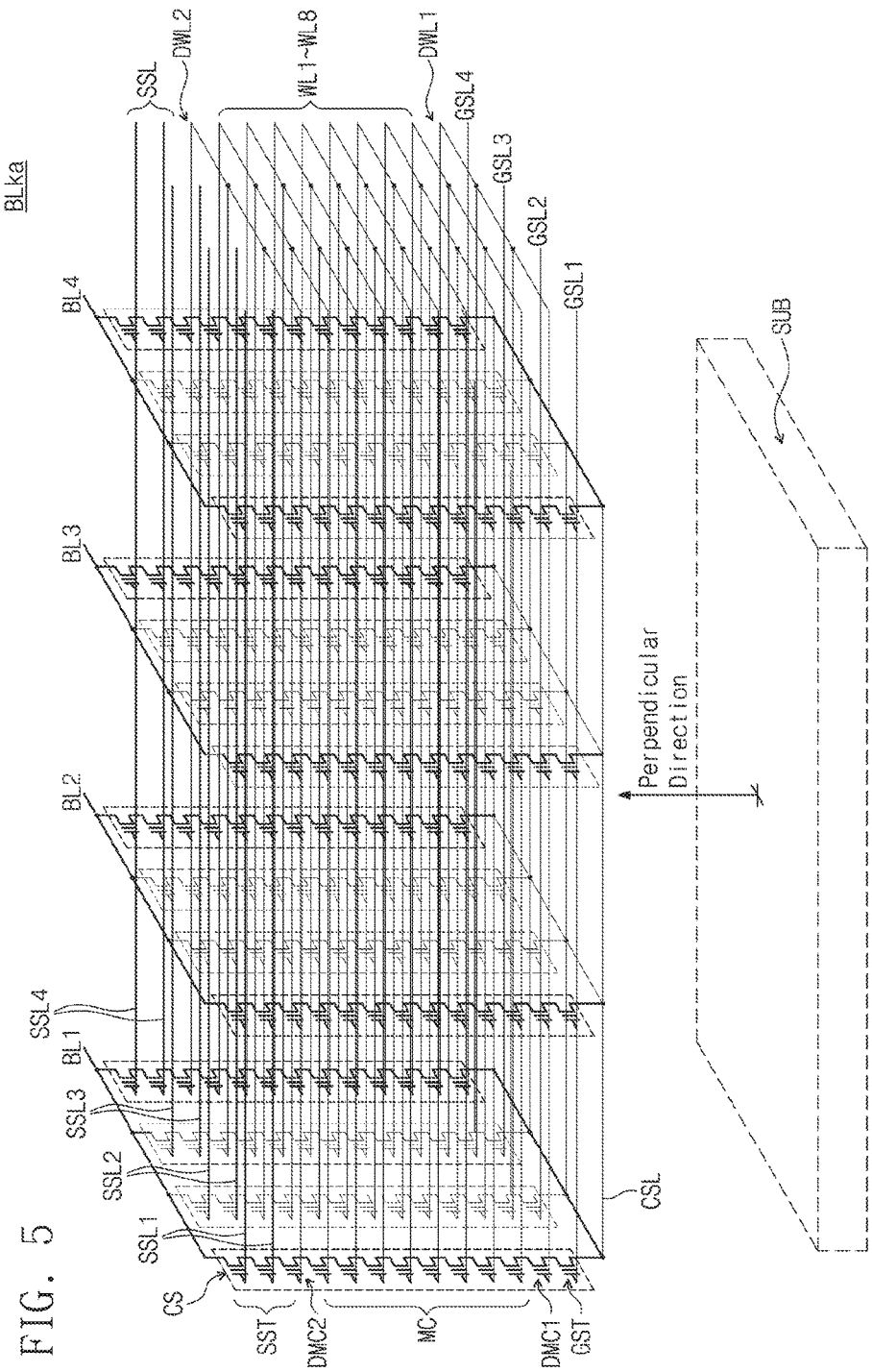
FIG. 5 shows an example of a memory block according to some example embodiments of inventive concepts.

FIG. 5 shows an example of a memory block BLKa according to some example embodiments of inventive concepts. Referring to FIGS. 1 and 5, a plurality of cell strings CS may be arranged on a substrate SUB in rows and columns. The cell strings CS may be connected in common to a common source line CSL that is formed on (or in) the substrate SUB. In FIG. 5, a location of the substrate SUB is shown as an example to help understand a structure of the memory block BLKa. An example is shown in FIG. 5 as the common source line CSL is connected to lower ends of the cell strings CS. However, the common source line CSL is sufficient as being electrically connected to the lower ends of the cell strings CS. However, inventive concepts are not limited to the case that the common source line CSL is physically located at the lower ends of the cell strings CS. An example is shown in FIG. 5 as the cell strings CS are arranged in a four-by-four matrix. However, the number of cell strings CS in the memory block BLKa may increase or decrease.

Cell strings of each row may be connected to a corresponding one of first to fourth ground selection lines GSL1 to GSL4 and a corresponding one of first to fourth string selection lines SSL1 to SSL4. Cell strings of each column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 are depicted to be light.

Each cell string CS may include at least one ground selection transistor GST connected to a corresponding ground selection line, a first dummy memory cell DMC1 connected to a first dummy word line DWL1, a plurality of memory cells MC respectively connected to a plurality of word lines WL1 to WL8, a second dummy memory cell DMC2 connected to a second dummy word line DWL2, and string selection transistors SST respectively connected to string selection lines SSL. In each cell string CS, the ground selection transistor GST, the first dummy memory cell DMC1, the memory cells MC, the second dummy memory cell DMC2, and the string selection transistors SST may be serially connected to each other along a direction perpendicular to the substrate SUB and may be sequentially stacked along a direction perpendicular to the substrate SUB.

In some example embodiments, as illustrated in FIG. 5, one or more dummy memory cells may be arranged between the ground selection transistor GST and the memory cells MC in each cell string CS. In each cell string CS, one or more dummy memory cells may be arranged between the string selection transistors SST and the memory cells MC. In each cell string CS, one or more dummy memory cells may be arranged between the memory cells MC. The dummy memory cells may have the same structure as the memory cells MC and may not be programmed (e.g., program inhibited) or may be programmed differently from the memory cells MC. For example, when memory cells are programmed to form two or more threshold voltage distributions, the dummy memory cells may be programmed to have one threshold voltage distribution range or to have threshold voltage distributions of which the number is less than that of the memory cells MC.

Memory cells of the cell strings CS that are arranged at the same height (or order) from the substrate SUB or the ground selection transistor GST may be electrically connected to each other. Memory cells of the cell strings CS that are arranged at different heights (or orders) from the substrate SUB or the ground selection transistor GST may be electrically separated from each other. An embodiment is established in FIG. 5 as memory cells of the same height are connected to the same word line. However, the memory cells of the same height may be directly connected to each other in a plane where the memory cells are formed or may be indirectly connected to each other through another layer such as a metal layer.

Memory cells that correspond to a string (or ground) selection line and a word line may constitute a page. A write operation and a read operation may be performed by the page. In each page, each memory cell may store two or more bits. Bits that are written in memory cells belonging to one page may form logical pages. For example, k-th bits that are respectively written in memory cells of each page may form a k-th logical page.

The memory block BLKa may be provided at a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In some example embodiments of inventive concepts, the 3D memory array includes vertical NAND strings (or cell strings) that are vertically oriented such that at least one memory cell is located over another memory cell. The at least one memory cell may comprise a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 6:
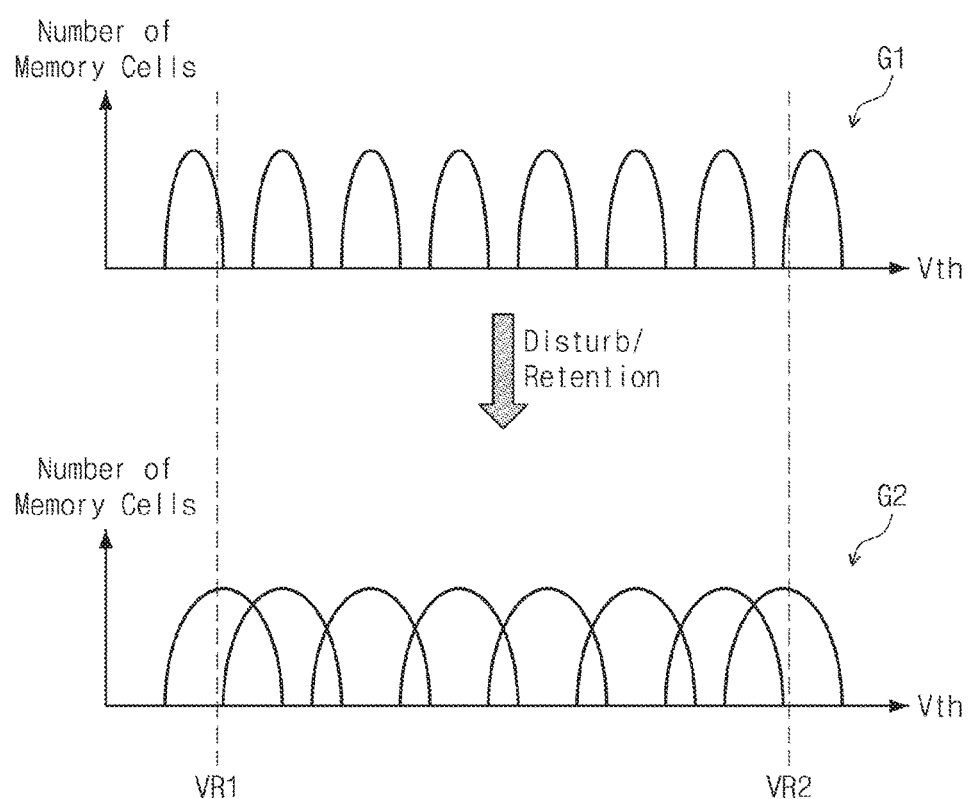
FIG. 6 shows an example in which a controller accesses a nonvolatile memory device.

FIG. 6 shows an example in which the controller 120 accesses the nonvolatile memory device 110. In first and second graphs G1 and G2 of FIG. 6, the abscissa represents threshold voltages of memory cells, and the ordinate represents the number of memory cells. In FIG. 6, it is assumed that three bits are written in each memory cell and one page has three logical pages. However, inventive concepts are not limited thereto.

Referring to FIGS. 1 and 5 and the first graph G1 of 6, each of memory cells may have eight states. The eight states may be defined by a threshold voltage range. As three bits are written in each memory cell, each memory cell may be programmed to have a threshold voltage Vth belonging to one of the eight states. The eight states may be distinguished by using seven read voltages the levels of which are within a range of eight threshold voltage distributions.

Disturbance and retention deterioration may occur after data are written in memory cells. The disturbance refers to a phenomenon in which threshold voltages of memory cells vary with programming, reading, erasing, coupling, etc. generated in a periphery of memory cells. The retention deterioration refers a phenomenon in which threshold voltages of memory cells vary as charges trapped in charge trap layers of the memory cells through a program operation are discharged over time.

In general, the disturbance and retention deterioration may cause an increase in threshold voltages of memory cells belonging to a low threshold voltage range and a decrease in threshold voltages of memory cells belonging to a high threshold voltage range. When the disturbance and retention deterioration occur, threshold voltages of memory cells may shift from the first graph G1 to the second graph G2.

Referring to the second graph G2, threshold voltages of memory cells belonging to different threshold voltage ranges may be mixed. For example, threshold voltages of memory cells belonging to a first threshold voltage range may shift to belong to a second threshold voltage range; in contrast, threshold voltages of memory cells belonging to the second threshold voltage range may shift to belong to the first threshold voltage range. When threshold voltages of memory cells vary as illustrated in the second graph G2, an error that is generated in a read operation may be uncorrectable by the error correction block 128.

A reliability verification read operation may be performed to limit and/or prevent an uncorrectable error from being generated in the read operation. The reliability verification read operation may make use of read voltages, the number of which is less than the number of read voltages used in a general read operation. For example, the reliability verification read operation may include at least one of a first operation of performing first reading by using a first read voltage VR1 and a second operation of performing reading by using a second read voltage VR2. A change in a threshold voltage due to the disturbance or retention deterioration may be monitored by comparing the number of turned-on on-cells with a threshold value during the first operation. A change in a threshold voltage due to the disturbance or retention deterioration may be monitored by comparing the number of turned-off off-cells with the threshold value during the second operation.

The storage device 100 according to some example embodiments of inventive concepts may generate an access classifier by applying machine learning to the reliability verification read operation. On the basis of the access classifier, the controller 120 may in advance classify (or predict) a result of the reliability verification read operation.

FIG. 7 shows an example of access result information AI and access environment information EI when machine learning is applied to a reliability verification read operation. Referring to FIGS. 1, 2, 6, and 7, the reliability verification read operation may be performed in the page corresponding to one string selection line and one word line.

The access environment information collection module 123_2 may collect at least one of a target block, a target string selection line, a target word line, a temperature, a time stamp, a program/erase count, an erase count, and a read count as the access environment information EI, but inventive concepts are not limited thereto.

The target block may include an address of a memory block in which the reliability verification read operation is performed or information about a location of a target block among all memory blocks BLK1 to BLKz, for example, information indicating whether the target block is located at the center of the memory blocks BLK1 to BLKz or corresponds to the outermost memory block.

The target string selection line may include an address of a string selection line corresponding to a page in which the reliability verification read operation is performed or information about a location of the string selection line in the target block, for example, information indicating whether the string selection line is closer to the first string selection line SSL1 or to the fourth string selection line SSL4.

The target word line may include an address of a word line connected to a page in which the reliability verification read operation is performed or information about a location of the word line in the target block, for example, information about a height of the word line from the substrate SUB.

The temperature refers to a temperature when the reliability verification read operation is performed on the nonvolatile memory device 110 under control of the controller 120.

The time stamp refers to a time when data is written in a page in which the reliability verification read operation is performed or a time that elapses after data is written.

The program/erase count refers to the number of program/erase cycles that are performed on the target block.

The read count refers to the number of times that a read operation is performed after data is written in the target block.

The information collection module 123_1 may collect at least one of information indicating whether the number of on-cells for the first read voltage VR1 is greater than a threshold value and information indicating whether the number of off-cells for the second read voltage VR2 is greater than a threshold value. For example, the threshold value for on-cells may be different from the threshold value for off-cells.

If the access environment information EI and the access result information AI are collected, the access classifier CF may be generated through machine learning. After the access classifier CF is generated, when the controller 120 intends to perform the reliability verification read operation on the nonvolatile memory device 110, result prediction may be previously made by using the access classifier CF before the reliability verification read operation is performed. For example, the access environment information collection module 123_2 may collect the environment information EI associated with an access to be performed. The classification module 123_4 may obtain the classification result CR by using the environment information EI and the access classifier CF.

If the reliability verification read operation is performed, the classification result CR may include at least one of information indicating whether the number of on-cells for the first read voltage VR1 is greater than a threshold value and information indicating whether the number of off-cells for the second read voltage VR2 is greater than a threshold value.

Figure 8:
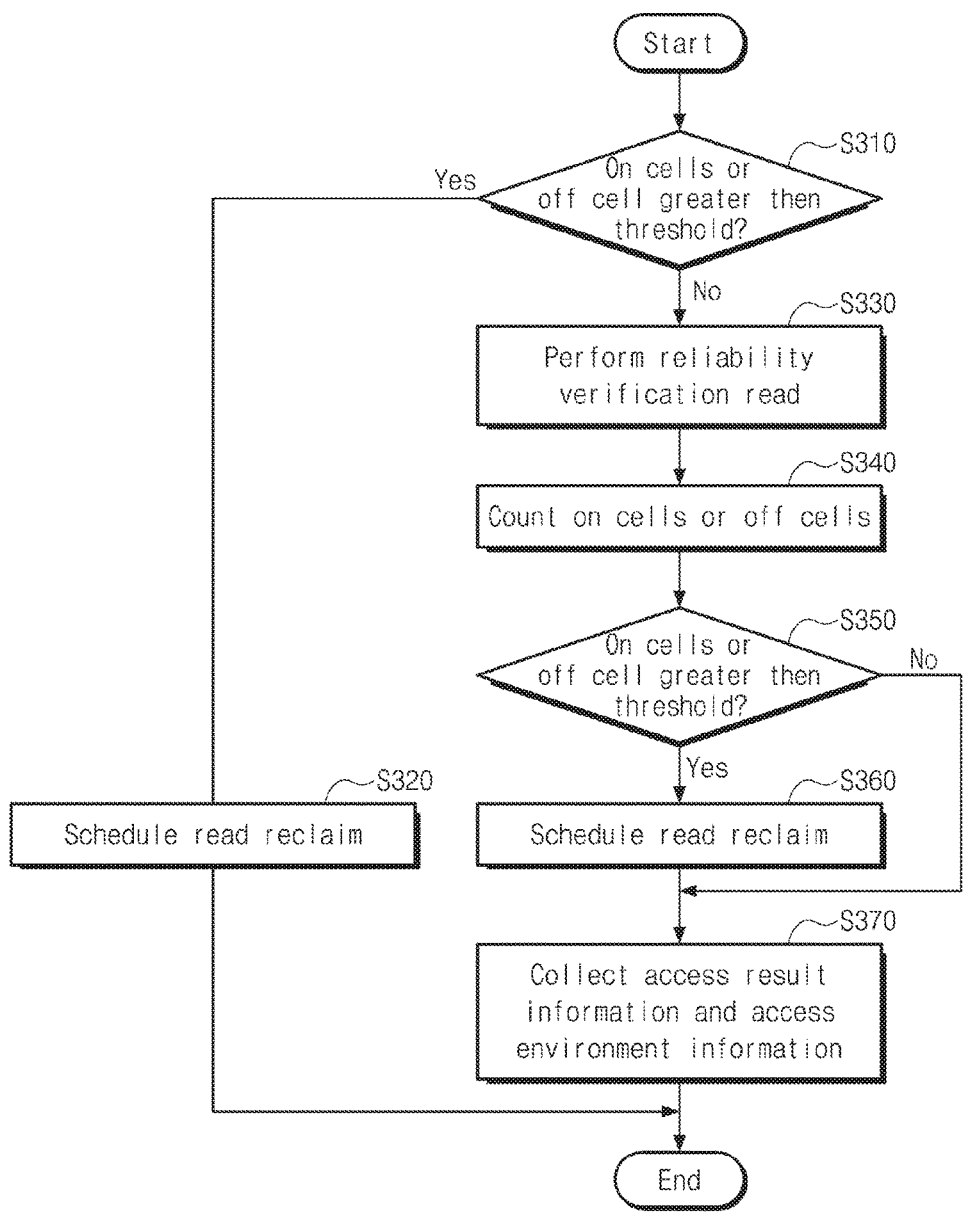
FIG. 8 shows an example of a method of processing a reliability verification read operation associated with a classification result after obtaining the classification result.

FIG. 8 shows an example of a method of processing a reliability verification read operation associated with the classification result CR after obtaining the classification result CR. Referring to FIGS. 1, 6, and 8, in operation S310, whether the classification result CR indicates that the number of on-cells or the number of off-cells is greater than a threshold value may be determined. For example, the controller 120 or the cores 122 may determine whether both or one of the number of on-cells for the first read voltage VR1 and the number of off-cells for the second read voltage VR2 is greater than a threshold value.

If it is determined that the classification result CR indicates that the number of on-cells or the number of off-cells is greater than the threshold value, in operation S320, the controller 120 or the cores 122 may schedule read reclaim of a page of an access classification (e.g., reliability verification read operation) target or read reclaim of a memory block, to which the page belongs. For example, the read reclaim includes reading data of a page or a memory block of the nonvolatile memory device 110 and writing the read data in another page or another memory block of the nonvolatile memory device 110. The disturbance and retention deterioration of data may disappear by performing the read reclaim.

If the classification result CR indicates that the number of on-cells or the number of off-cells is not greater than the threshold value, the process proceeds to operation S330. In operation S330, the controller 120 may perform the reliability verification read operation on a page in which the access classification is made. In operation S340, the controller 120 may count the number of on-cells for the first read voltage VR1 or the number of off-cells for the second read voltage VR2. Alternatively, the controller 120 may control the nonvolatile memory device 110 to allow the nonvolatile memory device 110 to count and output the number of on-cells or off-cells.

In operation S350, the controller 120 may determine whether the on-cell or off-cell count is greater than a threshold value. If the count is greater than the threshold value, then operation S360 and operation S370 are performed. If the count is not greater than the threshold value, operation S370 is performed without operation S360.

In operation S360, the controller 120 may schedule the read reclaim of a page, in which the reliability verification read operation is performed, or a memory block including the page. In operation S370, the controller 120 or the cores 123 may collect the access result information AI and the access environment information EI.

In short, the cores 122 may intend to perform the reliability verification read operation on a target page of a target block in the nonvolatile memory device 110 based on the internal policy. Before the cores 122 perform the reliability verification read operation practically, the cores 122 may request the classification result CR from the cores 123. The cores 123 may collect the access environment information EI associated with the target page and may output the classification result CR based on the collected result. The classification result CR indicates whether the number of on-cells or off-cells is greater than the threshold value.

If the classification result CR indicates that the number of on-cells or the number of off-cells is greater than the threshold value, that is, if the degree that data of memory cells are disturbed or degraded is predicted as being greater than the threshold value, the cores 122 schedule the read reclaim without performing the reliability verification read operation practically. The reliability verification read operation may end without execution. As illustrated by the first arrow A1 of FIG. 2, related information may not be collected when the reliability verification read operation is not performed.

If the classification result CR indicates that the number of on-cells or the number of off-cells is not greater than the threshold value, that is, if the degree that data of memory cells are disturbed or degraded is predicted as being not greater than the threshold value, the cores 122 may control the nonvolatile memory device 110 such that the nonvolatile memory device 110 performs the reliability verification read operation practically. The cores 122 may determine whether to schedule the read reclaim, based on the result of the reliability verification read operation. As illustrated by the second arrow A2 of FIG. 2, the access result information AI and the access environment information EI may be collected when the reliability verification read operation is practically performed.

FIG. 9 shows an example of the access result information AI and the access environment information EI when machine learning is applied to a read operation, a write operation, or an erase operation. Referring to FIGS. 1, 2, 4, and 9, the access environment information EI that is associated with the read operation, the write operation, or the erase operation includes at least one of a target block, a target string selection line, a target word line, a target logical page, a temperature, a time stamp, a program/erase count (or the number of program/erase cycles), and a read count. The access environment information EI may be the same as the access environment information EI of FIG. 7 except for the target logical page, and a description that is the same as that given with reference to FIG. 7 will not be repeated here.

The target logical page may include information about whether the target logical page belongs to any one of LSB, CSB, and MSB logical pages in the target page.

In some example embodiments, the write operation may be performed by the page or by the logical page. When the write operation is performed by the page, the access environment information EI associated with the write operation may include at least one of the remaining information of the access environment information EI of FIG. 9 other than the target logical page. When the write operation is performed by the logical page, the access environment information EI associated with the write operation may include at least one of the access environment information EI of FIG. 9. The read operation may be performed by the logical page. The access environment information EI associated with the read operation may include at least one of the remaining information of the access environment information EI of FIG. 9 other than the target logical page. The erase operation may be performed by the memory block. The access environment information EI associated with the erase operation may include at least one of the remaining information of the access environment information EI of FIG. 9 other than the target word line, the target logical page, and the target string selection line.

The access result information AI associated with the read operation, the write operation, or the erase operation may include at least one of a read level, a read pass level, whether to perform soft decision, a bit error rate (BER), a program start level, an increment of a program voltage, a program pass level, the number of program loops, an erase start level, an increment of an erase voltage, and the number of erase loops.

The access result information AI that is collected in connection with the read operation may include a read level, a read pass level, whether to perform soft decision, and a bit error rate BER. The read level refers to a level of a read voltage to be applied to a page, which is selected as a read target, through a word line. The read pass level refers to a level of a read pass voltage to be applied to word lines corresponding to pages, which are not selected as a read target, of a memory block selected as a read target. Whether to perform soft decision refers to whether to activate an operation, in which soft decision is performed by using read results that are obtained by performing a plurality of read operations on a selected page. The bit error rate BER refers a rate (or the number) of error bits that are detected after the error correction block 128 performs error correction decoding on data read from the nonvolatile memory device 110.

The access result information AI that is collected in connection with the write operation may include a program start level, an increment of a program voltage, a program pass level, and the number of program loops. The write operation is performed by repeating a program loop. The program start level refers to a level of a program voltage to be applied to a word line, which is selected as a write target, in a first program loop. The increment of the program voltage refers to a voltage level by which the program voltage is increased upon repeating the program loop. The program pass level refers to a level of the program pass voltage to be applied to word lines connected to pages that are not selected as a write target. The number of program loops refers to the number of program loops that are repeated until memory cells of a selected page are completely programmed.

The access result information AI that are collected in connection with the erase operation may include an erase start level, an increment of an erase voltage, and the number of erase loops. The erase operation is performed by repeating an erase loop. The erase start level refers to a level of an erase voltage to be applied to a memory block, which is selected as an erase target, in a first erase loop. The increment of the erase voltage refers to a voltage level by which the erase voltage is increased upon repeating the erase loop. The number of erase loops refers to the number of erase loops that are repeated until memory cells of the selected memory block are completely erased.

If the access environment information EI and the access result information AI are collected, the access classifier CF may be generated through machine learning. After the access classifier CF is generated, when the controller 120 intends to perform the write operation, the read operation, or the erase operation on the nonvolatile memory device 110, a result prediction may be in advance made by using the access classifier CF before the write operation, the read operation, or the erase operation is performed. For example, the access environment information collection module 123_2 may collect the environment information EI associated with an access to be performed. The classification module 123_4 may obtain the classification result CR by using the environment information EI and the access classifier CF.

The classification result CR may include at least one of a read level and a read pass level that cause a less error upon performing the read operation, whether to perform soft decision upon performing the read operation, and a bit error rate BER predicted upon performing the read operation. On the basis of the classification result CR, the controller 120 may select a read level or a read pass level or may determine whether to perform soft decision. Also, on the basis of the bit error rate BER of the classification result CR, the controller 120 may determine whether to perform a read operation (e.g., the read operation is not performed when the bit error rate BER is greater than a threshold value) and whether to schedule the read reclaim of a selected page or a memory block including the selected page (e.g., the controller 120 schedules the read reclaim when the bit error rate BER is greater than a threshold value).

The classification result CR may include a program start level, an increment of a program voltage, a program pass level, or the number of program loops for improving the reliability of data, reducing a program time, or limiting (and/or preventing) a program fail when the write operation is performed. The controller 120 may select a program start level, an increment of a program voltage, or a program pass level, based on the classification result CR. Also, on the basis of the number of program loops of the classification result CR, the controller 120 may determine whether to perform a write operation (e.g., the write operation is not performed when the number of program loops is greater than a threshold value) or whether to classify a memory block including a selected page as a bad block (e.g., the controller 120 classifies a memory block as a bad block when the number of program loops is greater than a threshold value).

The classification result CR may include an erase start level, an increment of an erase voltage, or the number of erase loops for improving the reliability of data, reducing an erase time, or limiting (and/or preventing) an erase fail when the erase operation is performed. The controller 120 may select a start level or an increment of an erase voltage, based on the classification result CR. Also, on the basis of the number of erase loops of the classification result CR, the controller 120 may determine whether to perform an erase operation (e.g., the erase operation is not performed when the number of erase loops is greater than a threshold value) and whether to classify a selected memory block as a bad block (e.g., the controller 120 classifies a memory block as a bad block when the number of erase loops is greater than a threshold value).

Figure 10:
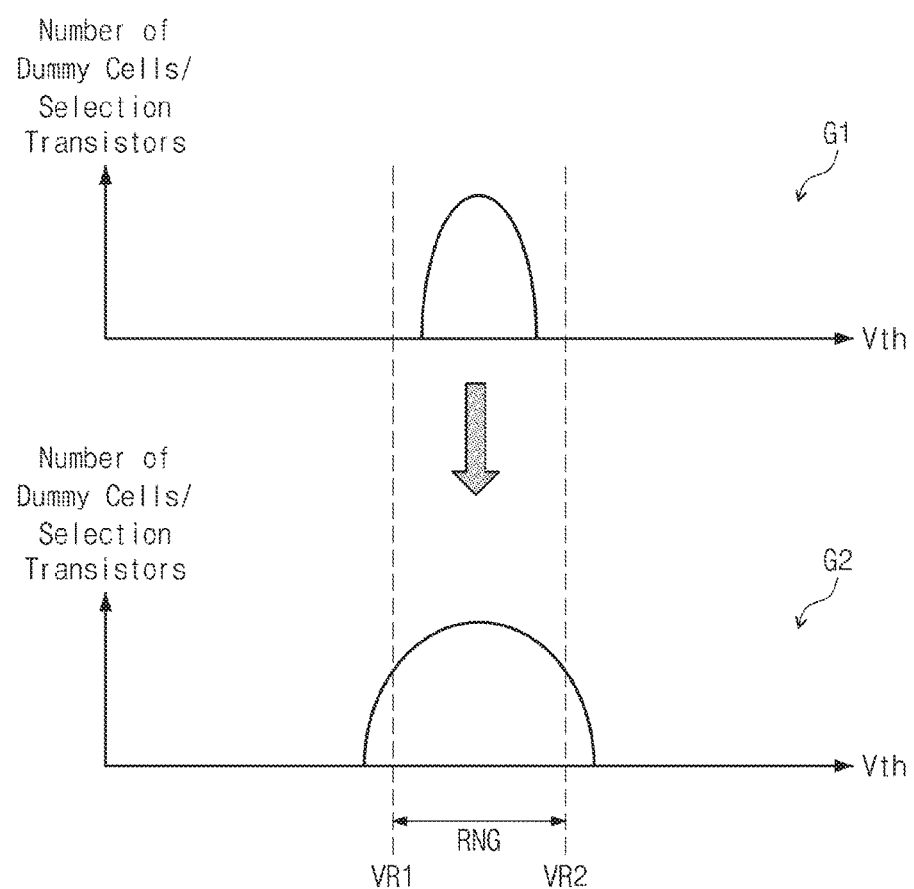
FIG. 10 shows another example in which the controller accesses the nonvolatile memory device 110.

FIG. 10 shows another example in which the controller 120 accesses the nonvolatile memory device 110. In first and second graphs G1 and G2 of FIG. 10, the abscissa represents threshold voltages of dummy memory cells or selection transistors, and the ordinate represents the number of dummy memory cells or selection transistors.

Referring to FIGS. 1 and 5 and the first graph G1 of 10, each dummy memory cell or selection transistor may have one logical state that is defined by one threshold voltage range. The dummy memory cells may include the first and second dummy memory cells DMC1 and DMC2 of FIG. 5. The selection transistors may include the string selection transistors SST and the ground selection transistors of FIG. 5.

Disturbance and retention deterioration may occur after the dummy memory cells or the selection transistors are programmed. When the disturbance and retention deterioration occur, threshold voltages of the dummy memory cells or the selection transistors may shift from the first graph G1 to the second graph G2.

If a threshold voltage distribution of the dummy memory cells or the selection transistors widens as illustrated by the second graph G2, the amounts of cell currents that are generated upon writing, reading, or erasing memory cells may vary. In this case, threshold voltages of memory cells are distributed to be wider, thereby causing a decrease in reliability of data written in the memory cells.

Threshold voltages of the dummy memory cells or the selection transistors may be checked to limit and/or prevent threshold voltages thereof from widening as illustrated by the second graph G2. For example, with regard to threshold voltages of the dummy memory cells or the selection transistors, read operations may be performed by using the first read voltage VR1 and the second read voltage VR2. If read operations are performed by using the first read voltage VR1 and the second read voltage VR2, whether threshold voltages of the dummy memory cells or the selection transistors leave a range RNG defined by the first and second read voltages VR1 and VR2 may be checked.

The storage device 100 according to some example embodiments of inventive concepts may generate an access classifier by applying machine learning to an operation of checking threshold voltages of the dummy memory cells or the selection transistors. On the basis of the access classifier, the controller 120 may in advance classify (or predict) a result of the check operation.

FIG. 11 shows an example of the access result information AI and the access environment information EI when machine learning is applied to a check operation. Referring to FIGS. 1, 2, 10, and 11, the check operation may be performed in units of selection transistors corresponding to one string selection line or one ground selection line or in units of dummy memory cells (e.g., by the dummy page) corresponding to one string selection line and one word line.

The access environment information collection module 123_2 may collect at least one of a target block, a target string selection line or target ground selection line, a target word line, a temperature, a time stamp, a program/erase count (or the number of program/erase cycles), and a read count. The access environment information EI about the dummy memory cells may include at least one of the access environment information EI of FIG. 11. The access environment information EI about the selection transistors may include at least one of the remaining information of the access environment information EI of FIG. 11 other than the target word line.

The access result information AI may include information about whether the number of dummy memory cells or selection transistors leaving the range RNG is greater than a threshold value.

If the access environment information EI and the access result information AI are collected, the access classifier CF may be generated through machine learning. After the access classifier CF is generated, when the controller 120 intends to perform the check operation on the nonvolatile memory device 110, result prediction may be in advance made by using the access classifier CF before the check operation is performed. For example, the access environment information collection module 123_2 may collect the environment information EI associated with the check operation to be performed. The classification module 123_4 may obtain the classification result CR by using the environment information EI and the access classifier CF. The classification result CR may include information about whether the number of dummy memory cells or selection transistors having threshold voltages leaving the range RNG is greater than the threshold value.

Figure 12:
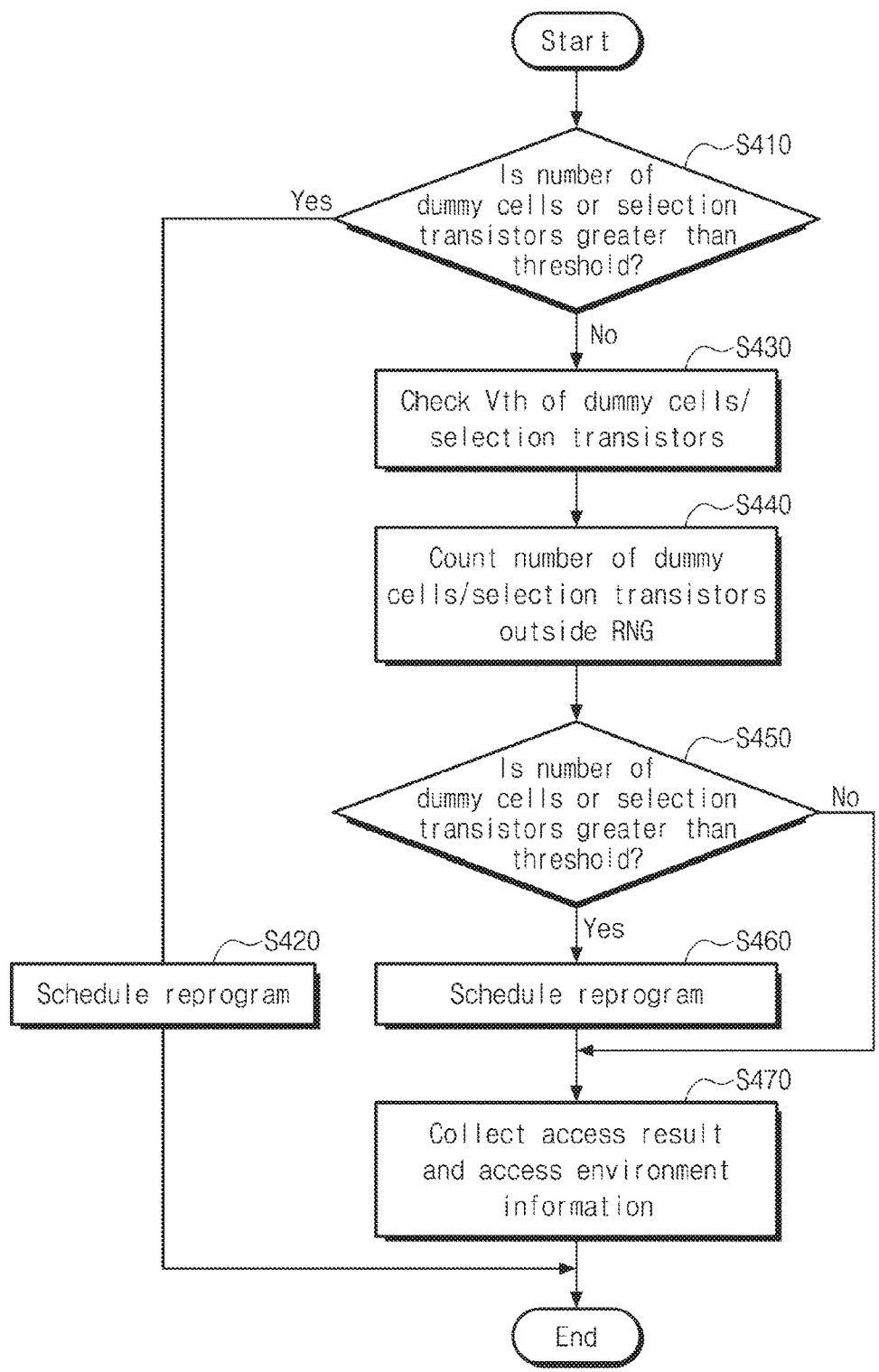
FIG. 12 shows an example of a method of processing a check operation associated with a classification result after obtaining the classification result.

FIG. 12 shows an example of a method of processing a check operation associated with the classification result CR after obtaining the classification result CR. Referring to FIGS. 1, 10, and 12, in operation S410, whether the classification result CR indicates that the number of dummy memory cells or selection transistors is greater than a threshold value may be determined. For example, the controller 120 or the cores 122 determines whether the number of dummy memory cells or selection transistors having threshold voltages leaving the range RNG is greater than a threshold value.

If it is determined that the classification result CR indicates that the number of dummy memory cells or selection transistors is greater than the threshold value, in operation S420, the controller 120 or the cores 122 may schedule a reprogram operation of a memory block to which selection transistors or dummy memory cells of an access classification target (e.g., a check target) belong. For example, the reprogram operation may include increasing threshold voltages of selection transistors or dummy memory cells by programming the selection transistors or dummy memory cells, of which threshold voltages are lowered, or increasing the threshold voltages of the selection transistors or dummy memory cells by programming the selection transistors or dummy memory cells after erasing the selection transistors or dummy memory cells such that threshold voltages thereof are lowered.

If the classification result CR indicates that the number of selection transistors or dummy memory cells is not greater than the threshold value, the process proceeds to operation S430. In operation S430, the controller 120 may perform the check operation for checking threshold voltages of the selection transistors or the dummy memory cells. In operation S440, the controller 120 may count the number of dummy memory cells or selection transistors having threshold voltages leaving the range RNG. Alternatively, the controller 120 may control the nonvolatile memory device 110 to allow the nonvolatile memory device 110 to count and output the number of dummy memory cells or selection transistors having threshold voltages leaving the range RNG.

In operation S450, the controller 120 determines whether the number of dummy memory cells or selection transistors having threshold voltages leaving the range RNG is greater than the threshold value. If the number of dummy memory cells or selection transistors is greater than the threshold value, operation S460 and operation S470 are performed. If the number of dummy memory cells or selection transistors is not greater than the threshold value, operation S470 is performed without operation S460.

In operation S460, the controller 120 may schedule the reprogram operation of a memory block in which the check operation is performed. In operation S470, the controller 120 or the cores 123 may collect the access result information AI and the access environment information EI.

FIG. 13 shows an example in which results of access operations are classified by using a result of a sub access operation as the access environment information EI. In some example embodiments, the sub access operation may be the reliability verification read operation described with reference to FIG. 6, and the access operation may be a read operation.

Referring to FIGS. 1, 2, 6, and 13, the access environment information EI may include information about the number of on-cells for the first read voltage VR1 and the number of off-cells for the second read voltage VR2 in the reliability verification read operation on a selected page. The access environment information EI may further include at least one of a target block, a target string selection line, a target word line, a temperature, a time stamp, a program/erase count (or the number of program/erase cycles), and a read count.

The access result information AI may include information about whether an error bit rate BER when a read operation is performed on a selected page exceeds a threshold value.

If the access environment information EI and the access result information AI are collected, the access classifier CF may be generated through machine learning.

Figure 14:
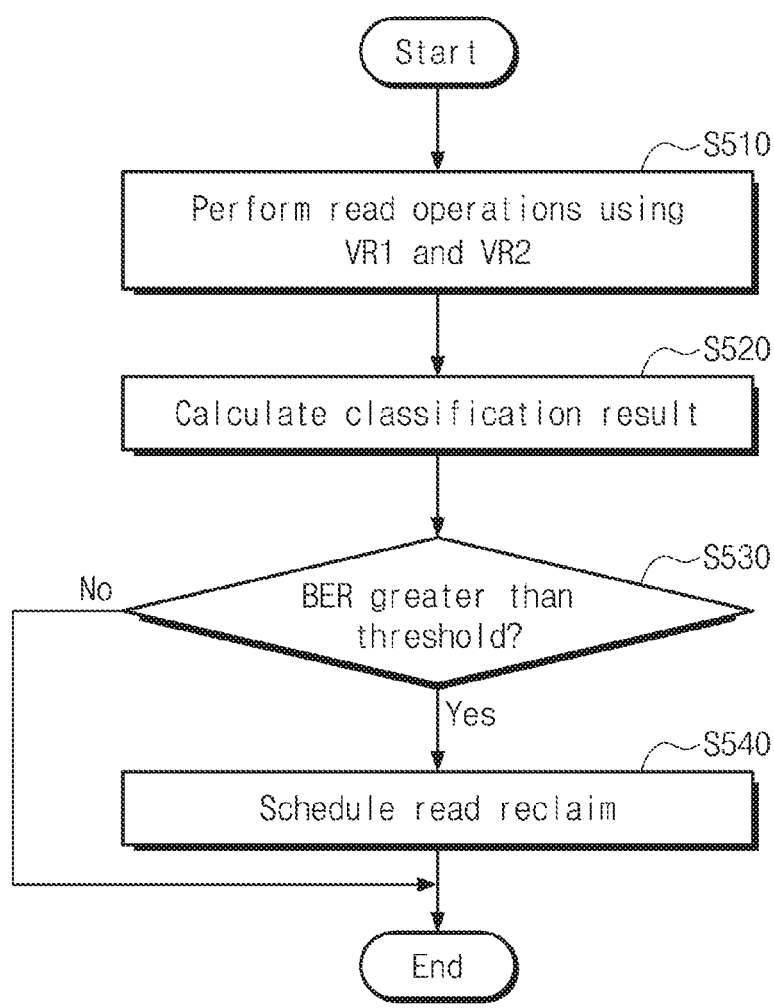
FIG. 14 shows an example of a method of using the access environment information and the access result information of FIG. 13.

FIG. 14 shows an example of a method of using the access environment information EI and the access result information AI of FIG. 13. In some example embodiments, classification using the environment information EI and the access result information AI may be applied to a portion of the reliability verification read operation.

Referring to FIGS. 1, 13, and 14, in operation S510, the controller 120 may perform the reliability verification read operation on the nonvolatile memory device 110. The number of on-cells and the number of off-cells that are obtained through the reliability verification read operation may be collected as the access environment information EI.

In response to performing the reliability verification read operation, in operation S520, the access classifier CF may obtain the classification result CR by using the collected environment information EI. For example, the classification module 123_4 may predict (or classify) a rate of error bits (e.g., BER) that are generated upon performing not the reliability verification read operation but the read operation on a selected page. The classification result CR may include information about whether the bit error rate BER is greater than a threshold value.

In operation S530, whether the classification result CR indicates that the bit error rate BER is greater than the threshold value may be determined. If the classification result CR indicates that the bit error rate BER is not greater than the threshold value, the reliability verification read operation ends. If the classification result CR indicates that the bit error rate BER is greater than the threshold value, in operation S540, the controller 120 may schedule the read reclaim of a page selected as a reliability verification read target or a memory block including the selected page.

Compared with the example FIGS. 13 and 14, the example of FIGS. 6 to 8 determines whether to perform the reliability verification read operation based on the access environment information EI before the reliability verification read operation is performed. Whether to schedule the read reclaim may be determined by only comparing the number of on-cells or the number of off-cells with a threshold value.

The embodiment of FIGS. 13 and 14 performs the reliability verification read operation and may use a result of the reliability verification read operation as access environment information. In the reliability verification read operation, whether to schedule the read reclaim may be determined by classifying (or predicting) a bit error rate BER when the read operation is performed, based on the access environment information EI and comparing the bit error rate BER with a threshold value. That is, the classification is used to determine whether to perform the read reclaim after the reliability verification read operation is performed.

In some example embodiments, the reliability verification read operation may be randomly or periodically performed as the read operation is performed. The result of the reliability verification read operation and the result of a read operation corresponding to the reliability verification read operation may be collected as access environment information.

FIG. 15 shows an application of access result information AI. For example, an example of information (e.g., called "default information"), which is used to constitute (or organize) the access classifier CF and is classified (or predicted) by the access classifier CF as the classification result CR, of the access result information AI is illustrated in FIG. 15.

Referring to FIGS. 1, 2, and 15, the default information may include information about read operation, information about a program operation, information about an erase operation, and information about a general operation.

The information about the read operation may include at least one of a read level, a read pass level, whether to perform soft decision, and whether to schedule read reclaim. For example, when the read operation of the nonvolatile memory device 110 is performed, the cores 122 may collect information about at least one of a read level used during the read operation, a read pass level, whether to perform the soft decision, and whether to schedule the read reclaim. The collected information may be applied for the cores 123 for the machine learning to create (or update) the access classifier CF. The cores 122 may input the access environment information EI (refer to FIG. 17) in the access classifier CF when intending to perform the read operation on the nonvolatile memory device 110. The access classifier CF may predict (or classify) at least one of the read level, the read pass level, whether to perform the soft decision, and whether to schedule the read reclaim and may output the classification result CR (or the prediction result). The cores 122 may adjust at least one of the following conditions for performing the read operation based on the classification result CR: the read level, the read pass level, whether to perform the soft decision, and whether to schedule the read reclaim.

The information about the program operation may include at least one of a program start level, a program pass level, a program increment level, a program verification level for determining whether threshold voltages of memory cells correspond to program pass, and whether to perform optional encoding. For example, when the program operation of the nonvolatile memory device 110 is performed, the cores 122 may collect information about at least one of the program start level used during the read operation, the program pass level, the program increment level, the program verification level, and whether to perform optional encoding. The collected information may be applied for the cores 123 for the machine learning to create (or update) the access classifier CF. The cores 122 may input the access environment information EI (refer to FIG. 17) in the access classifier CF when intending to perform the program operation on the nonvolatile memory device 110. The access classifier CF may predict (or classify) at least one of the program start level, the program pass level, the program increment level, the program verification level, and whether to perform optional encoding and may output the classification result CR (or the prediction result). The cores 122 may adjust at least one of the following conditions for performing the program operation based on the classification result CR: the program start level, the program pass level, the program increment level, the program verification level, and whether to perform optional encoding. For example, the optional encoding may include encryption, state shaping for reducing the number of memory cells programmed to specific program states, randomization for changing data bits to any patterns, interleaving for changing arrangement of pieces of data, etc.

The information about the erase operation may include at least one of an erase start level, an erase increment level, and an erase verification level. For example, when the erase operation of the nonvolatile memory device 110 is performed, the cores 122 may collect information about at least one of the erase start level used during the erase operation, the erase increment level, and the erase verification level. The collected information may be applied for the cores 123 for the machine learning to create (or update) the access classifier CF. The cores 122 may input the access environment information EI (refer to FIG. 17) in the access classifier CF when intending to perform the erase operation on the nonvolatile memory device 110. The access classifier CF may predict (or classify) at least one of the erase start level, the erase increment level, and the erase verification level and may output the classification result CR (or the prediction result). The cores 122 may adjust at least one of the following conditions for performing the erase operation based on the classification result CR: the erase start level, the erase increment level, and the erase verification level.

The information about the general operation may include at least one of whether to schedule garbage collection, to whether to schedule wear leveling, whether to schedule a bad block process, whether to schedule reliability verification read, and whether to schedule access result information (AI) read. For example, when at least one of the garbage collection, the wear leveling, the bad block process, the reliability verification read, and the access result information read is performed on the nonvolatile memory device 110, the cores 122 may collect access result information associated with an access operation (e.g., a read, program, or erase operation) that causes at least one of the garbage collection, the wear leveling, the bad block process, the reliability verification read, and the access result information read. The collected information may be applied for the cores 123 for the machine learning to create (or update) the access classifier CF. The cores 122 may input the access environment information EI (refer to FIG. 17) in the access classifier CF when intending to perform the erase operation on the nonvolatile memory device 110, when performing the erase operation, or after performing the erase operation. The access classifier CF may predict (or classify) at least one of whether to schedule the garbage collection, whether to schedule the wear leveling, whether to schedule the bad block process, whether to schedule the reliability verification read, and whether to schedule the access result information read and may output the classification result CR (or prediction result). The cores 122 may decide at least one of whether to schedule the garbage collection, whether to schedule the wear leveling, whether to schedule the bad block process, whether to schedule the reliability verification read, and whether to schedule the access result information read based on the classification result CR. For example, the wear leveling may include swapping data of a first memory block, for example, hot data of a high access frequency and block of a second memory block, for example, cold data of a low access frequency each other. The access result information read may correspond to a read operation that the cores 122 randomly schedule to obtain the access result information AI.

FIG. 16 shows another application of the access result information AI. For example, an example of information (e.g., called "additional information"), which is used to constitute (or organize) the access classifier CF, of the access result information AI is illustrated in FIG. 16.

Referring to FIGS. 1, 2, 16, the additional information may include general information (or physical information), distribution information, deterioration information, and logical information.

The general information includes general characteristic information of the nonvolatile memory device 110. The general information may include information about physical characteristic of the nonvolatile memory device 110. The general information may include a program time, an erase time, the number of read iterations, the number of errors, a physical location, locations of bad blocks, and an error correction time.

The program time indicates a time needed to perform a program operation. The program time may be calculated and managed for each page, for each word line, for each string selection line, for each memory block, for each group of two or more memory blocks. The program time may be one of an individual time, an average time, a maximum time, a minimum time, and an intermediate time. The program time, for example, may be quantified in various forms such as the number of program pulses, the number of pass cells that are program passed in one program loop, and the amount of program charges accumulated or trapped in one program loop.

The erase time indicates a time needed to perform an erase operation. The erase time may be calculated and managed for each page, for each word line, for each string selection line, for each memory block, for each group of two or more memory blocks. The erase time may be one of an individual time, an average time, a maximum time, a minimum time, and an intermediate time. The erase time, for example, may be quantified in various forms such as the number of erase pulses, the number of pass cells that are erase passed in one erase loop, and the amount of erase charges discharged in one erase loop.

The number of read iterations may indicate the number of times of read retry performed during a read operation. For example, the cores 122 may perform the read retry when the number of error bits of data read from the nonvolatile memory device 110 exceeds a correctable range. On the basis of a given schedule or the access environment information EI, the cores 122 may select one of a plurality of read retry schemes to perform the second read operation. If the second read operation is not successful, the cores 122 may select another read retry scheme to perform the third read operation. As such, if a read operation is not successful, read operations are iterated according to the read retry schemes. The number of read iterations may indicate the number of times that a read operation is iterated.

The number of errors may indicate the number of error bits detected by the error correction block 128. That a read operation is not successful may indicate the detected error is uncorrectable.

The physical location indicates a physical location of target memory cells experiencing a read, program, or erase operation. For example, in a memory cell array of the nonvolatile memory device 110, physical characteristics of memory cells may change with physical locations of the memory cells. For example, memory cells that are situated at the center of the memory cell array may have reliability higher than memory cells that are situated at a periphery of the memory cell array. To apply the above-described physical characteristic, the physical location may be collected as the access result information AI.

The probability that memory blocks that are arranged adjacent to a bad block become bad blocks may be higher than the probability that memory blocks that are not arranged adjacent to a bad block become bad blocks. To apply the above-described physical characteristic, locations of bad blocks may be collected as the access result information AI. The error correction time may indicate a time needed to perform error correction of a read operation in the error correction block 128.

The distribution information may include at least one of a valley level, a peak level, and a slope between the valley level and the peak level. As illustrated in the second graph G2 of FIG. 6, distribution ranges of threshold voltages of memory cells may overlap each other. The valley level may indicate a center point at which two distribution ranges overlap each other, for example, a threshold voltage level of a valley that the two distribution ranges overlapping each other form. The peak level indicates a threshold voltage level of a peak point of each distribution range. For example, to seize distribution information, the cores 122 may perform a read operation for seizing the distribution information within an idle time. For example, the cores 122 may grasp distribution information of one or two distribution ranges (e.g., the lowest distribution range or the highest distribution range) and may estimate distribution information of the remaining distribution ranges based on the grasped result. For example, if a reference time elapses after grasping distribution information, the distribution information may be discarded or ignored in consideration of deterioration of retention.

The deterioration information may include deterioration of memory cells or deterioration of data written in memory cells. The deterioration information may include at least one of a program and erase cycle, a read count, a time after program (e.g., a program stamp), the total number of pulses, and a level of voltage.

The program and erase cycle may be calculated and managed for each page, for each word line, for each string selection line, for each memory block, or for each group of two or more memory blocks. The program and erase cycle may indicate the number of times that a program operation or an erase operation is performed. The program and erase cycle may indicate deterioration information of memory cells.

The read count may include the number of read operations that are performed after data are written in memory cells. Since disturbance occurs when a read operation is performed, the read count may indicate deterioration of data. The read count may further include the total number of times that memory cells are read. In this case, the read count may further indicate deterioration of memory cells.

The time after program indicates a time that elapses after data are written in memory cells. Retention deterioration progresses as a time elapses after data are written in memory cells. Accordingly, the time after program indicates deterioration of data. For example, the time after program may be calculated by using a time stamp that is generated when a program operation is performed.

The total number of pulses may be calculated and managed for each page, for each word line, for each string selection line, for each memory block, or for each group of two or more memory blocks. The total number of pulses may include the total number of program pulses, erase pulses, and read pulses (e.g., pulses of read pass voltages) applied to memory cells. The total number of pulses may indicate deterioration of memory cells.

The level of voltage may be calculated and managed for each page, for each word line, for each string selection line, for each memory block, or for each group of two or more memory blocks. The level of voltage may include a maximum (or average) level of program, read, or erase applied to memory cells. The level of voltage may indicate deterioration of memory cells.

For example, at least one of a program speed, an erase speed, the number of read iterations, the number of errors, and an error correction time of memory cells may change as the memory cells deteriorate. Accordingly, at least one of the program speed, the erase speed, the number of read iterations, the number of errors, or the error correction time may be optionally managed as deterioration information.

The logical information indicates whether data to be written in memory cells or data written in memory cells are hot data, warm data, or cold data. For example, data may be classified into hot data, warm data, and cold data based on a program or read frequency. The program or read frequency of the warm data may be higher than that of the cold data. The program or read frequency of the hot data may be higher than that of the cold data. Information about the hot data, the warm data, and the cold data may be obtained by measuring and grasping the program or read frequency at the cores 122 or may be provided from an external host device to the cores 122.

The logical information may include map data update. For example, map data includes information between logical addresses of a host device and physical addresses of the nonvolatile memory device 110. The cores 122 may collect map data itself or update information of the map data as the access result information AI.

FIG. 17 shows an application of the access environment information EI. Referring to FIGS. 1, 2, 3, and 17, the cores 122 may obtain information about temperature and humidity when an access is performed or information about a temperature and humidity change, by using sensors (not illustrated). A request for an access to the nonvolatile memory device 110 may include an address. The address may distinguish memory cells to be accessed. The cores 122 may input temperature, humidity, and access target information in the classifier CF as the access environment information EI.

Figure 18:
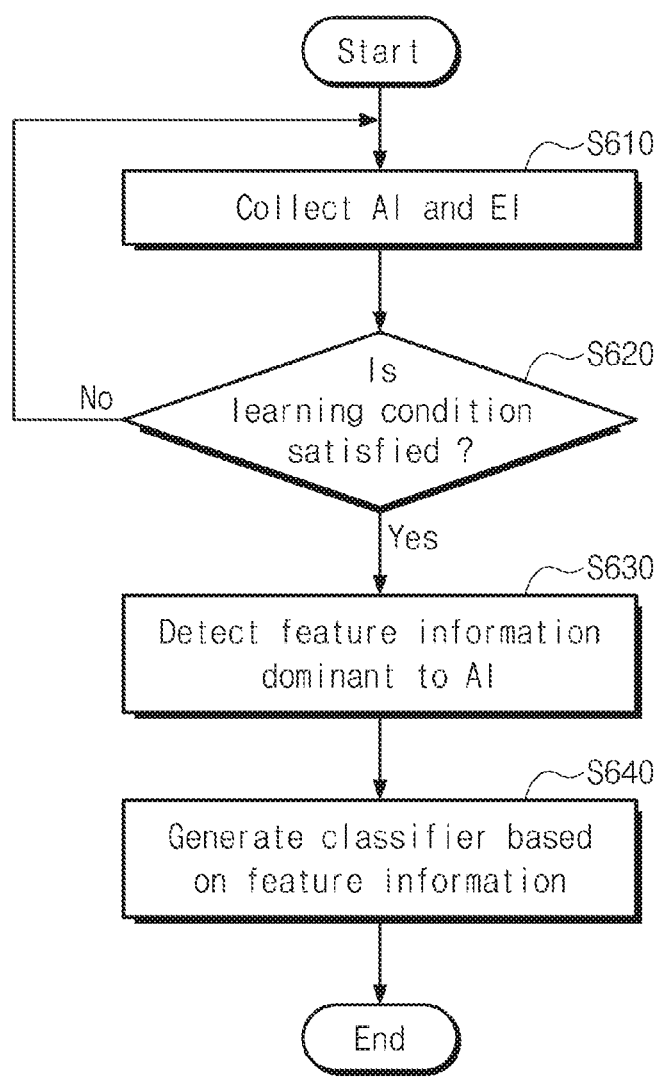
FIG. 18 is a flowchart illustrating an example of an operating method of the storage device.

FIG. 18 is a flowchart illustrating an example of an operating method of the storage device 100. Referring to FIGS. 1, 2, and 18, in operation S610, the cores 122 may collect the access result information AI and the access environment information EI when an access to the nonvolatile memory device 110 is made. In operation S620, the cores 122 may determine whether a learning condition is satisfied. If the learning condition is not satisfied, the process proceeds to operation S610, in which the access result information AI and the access environment information EI are continuously collected. If the learning condition is satisfied, the process proceeds to operation S630.

In operation 630, the cores 123 for machine learning may detect feature information dominant to the access result information AI. For example, the cores 123 may detect a portion of the access result information AI and the access environment information EI, which has a dominant influence on default information illustrated in FIG. 15 as feature information.

In operation S640, the cores 123 may generate (or update) the access classifier CF based on the feature information. That is, the cores 123 may generate (or update) the access classifier CF by using feature information of a portion of the access result information AI and the access environment information EI, not all thereof. For example, a kind of the feature information may be reset and again detected when the access classifier CF is generated or updated, periodically (or at a uniform time interval), when the access classifier CF is generated or updated by a reference count.

Figure 19:
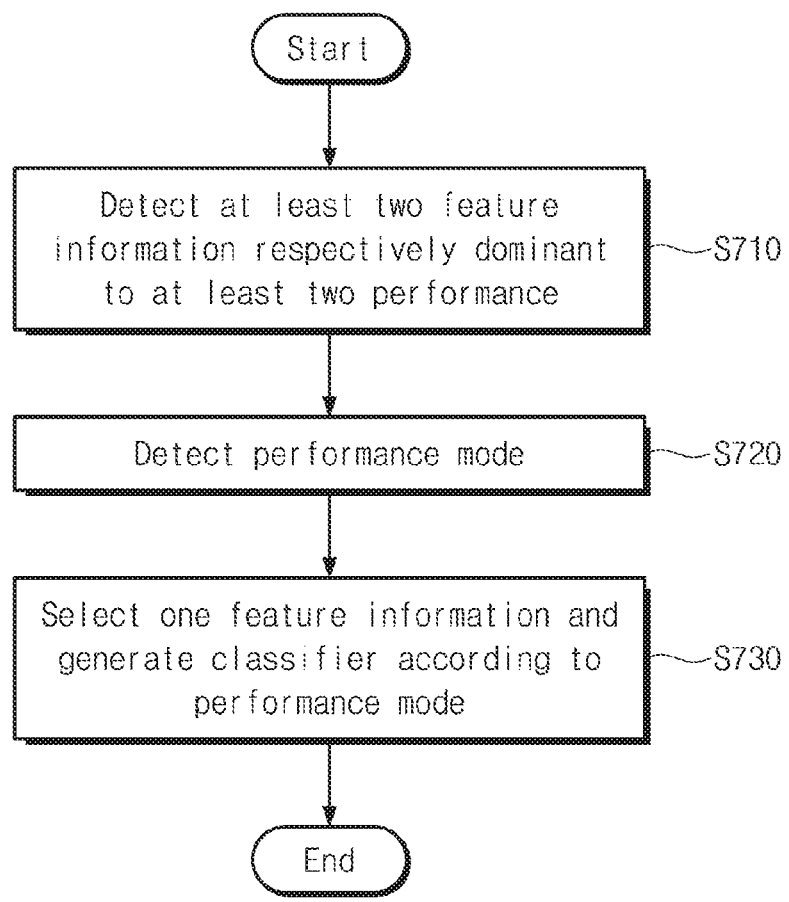
FIG. 19 is a flowchart illustrating an example in which the storage device selects feature information based on a mode.

FIG. 19 is a flowchart illustrating an example in which the storage device 100 selects feature information based on a mode. Referring to FIGS. 1, 2, and 19, in operation S710, the cores 123 may detect at least two pieces of feature information dominant to at least two performances. For example, first feature information and second feature information that respectively correspond to a first performance and a second performance may be detected. The first performance and the second performance may be a speed and reliability, respectively. Compared to the second feature information, the first feature information may have a dominant influence on improving an access speed. Compared to the first feature information, the second feature information may have a more dominant influence on improving reliability, for example, deterioration of data or deterioration of memory cells. A portion of the first feature information may overlap a portion of the second feature information.

In operation S720, the cores 123 may determine a mode of performance. For example, the mode of performance may be set by an external host device. The mode of performance may be set by a fuse option in the controller 120. The mode of performance may be set when the controller 120 is manufactured. If the controller 120 selects pieces of feature information based on the mode of performance, the operating performance of the storage device 100 may be adjusted according to the intention of user.

Figure 20:
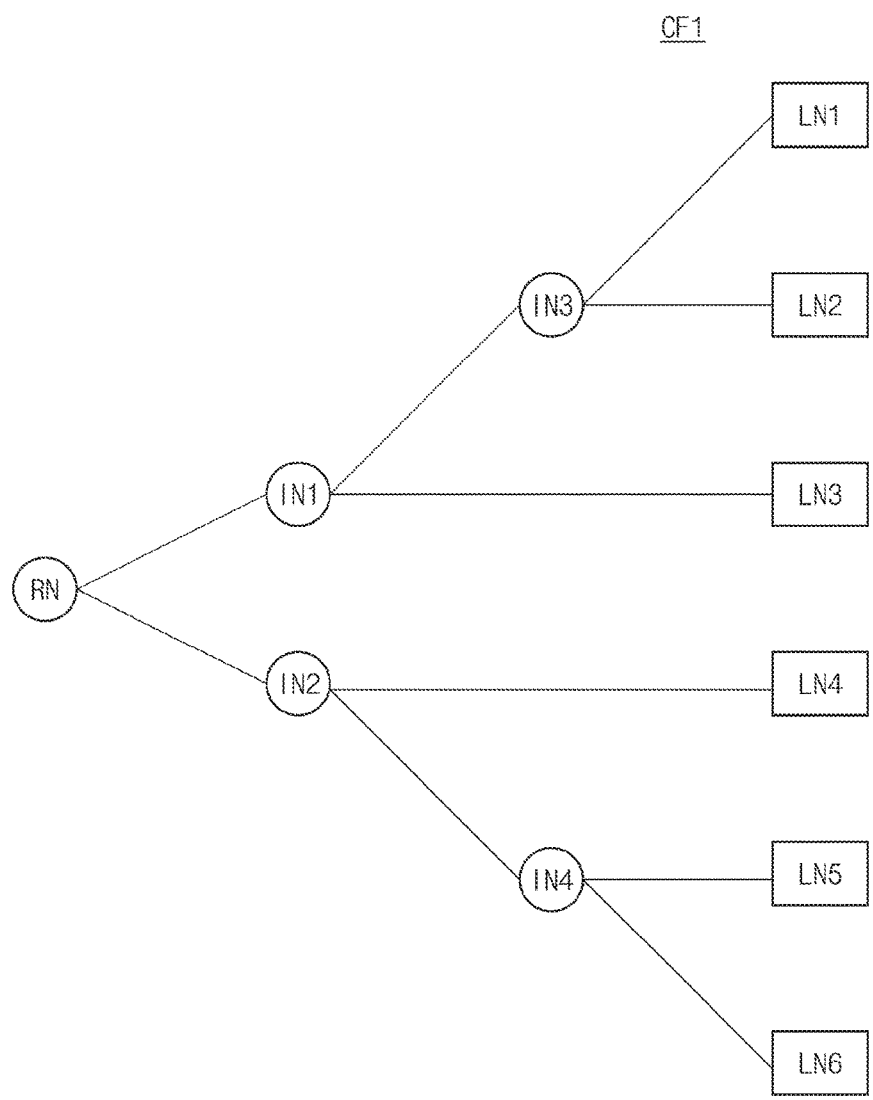
FIG. 20 shows an example of an access classifier generated by machine learning.

FIG. 20 shows an example of an access classifier CF1 generated by machine learning. In some example embodiments, the access classifier CF1 may be a decision tree. Referring to FIGS. 1 to 20, an access classifier CF1 includes a root node RN, first to fourth internal nodes IN1 to IN4, and first to sixth leaf nodes LN1 to LN6. The root node RN, the first to fourth internal nodes IN1 to IN4, and the first to sixth leaf nodes LN1 to LN6 may be connected through branches.

In each of the root node RN and the first to fourth internal nodes IN1 to IN4, comparison may be made with respect to one of the access environment information EI. One of branches connected to each node is selected according to the comparison result. When another internal node has been connected to the selected branch, comparison may be made with respect to another one of the access environment information EI in an internal node. When a leaf node has been connected to the selected branch, a value of the leaf value may be obtained as the classification result CR. In some example embodiments, information, which has the highest selectivity, of the access environment information EI may be compared with the access environment information EI in the root node RN.

Machine learning that is based on collected information may include determining a comparison value that is compared with the access environment information EI in each of the root node RN and the first to fourth internal nodes IN1 to IN4.

An initial access classifier CF1 may be mounted in the storage device 100 when the storage device 100 is manufactured and sold. For example, the initial access classifier CF1 may be generated based on the access result information AI and the access environment information EI that are collected from a plurality of users by a manufacturer of the storage device 100. The initial access classifier CF1 may be viewed as being generated by 'off-line' learning, in that the initial access classifier CF1 is generated by previously collected information.

While the storage device 100 is being used by a user after being sold, the access classifier CF1 may be updated by the access environment information EI and the access result information AI of the user. The access classifier CF1 may be constantly and/or consistently updated. Updating of the access classifier CF1 may be made by machine learning through which a comparison value that is compared with the access environment information EI in each of the root node RN and the first to fourth internal nodes IN1 to IN4 is updated. Since the access classifier CF1 is updated by using real-time access result information AI and real-time access environment information EI by the user after the storage device 100 is sold, the access classifier CF1 may be updated by 'on-line' learning.

Figure 21:
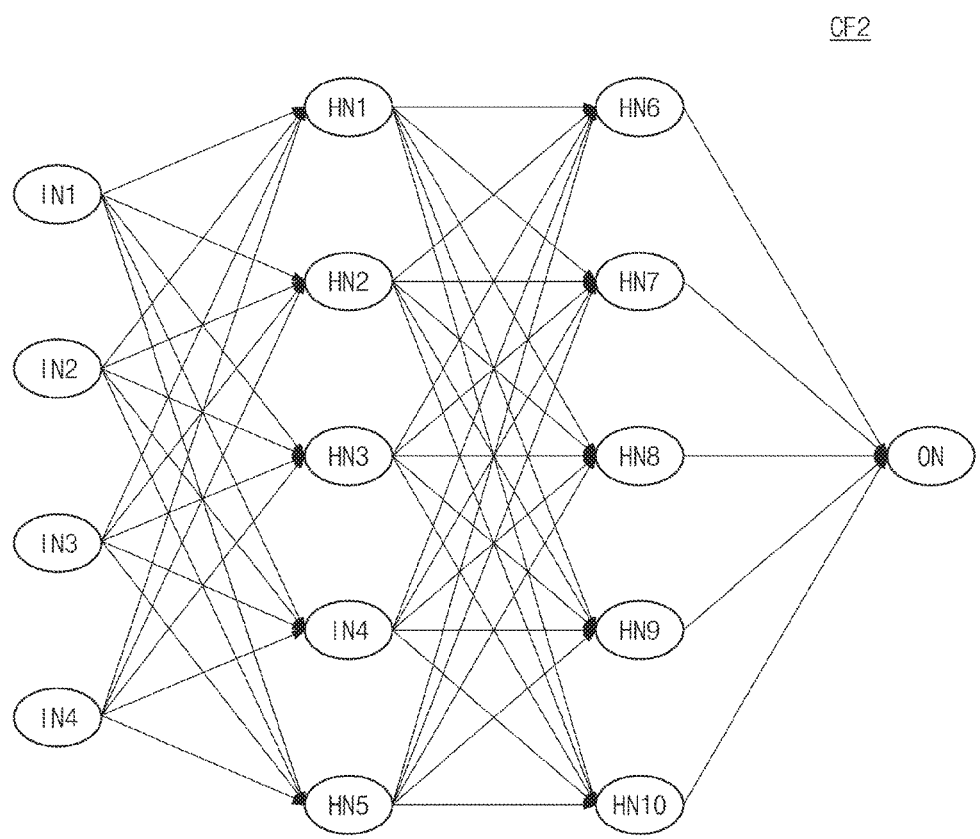
FIG. 21 shows another example of an access classifier generated by machine learning.

FIG. 21 shows another example of an access classifier CF2 generated by machine learning. In some example embodiments, the access classifier CF2 may be a neural network. Referring to FIGS. 1 and 21, the access classifier CF2 includes first to fourth input nodes IN1 to IN4, first to tenth hidden nodes HN1 to HN10, and an output node ON. The number of input nodes, the number of hidden nodes, and the number of output nodes may be determined in advance upon constructing the neural network.

The first to fourth input nodes IN1 to IN4 form an input layer. The first to fourth hidden nodes HN1 to HN5 form a first hidden layer. The sixth to tenth hidden nodes HN6 to HN10 form a second hidden layer. The output node ON forms an output layer. The number of hidden layers may be determined in advance upon constructing the neural network.

The access environment information EI may be input to the first to fourth input nodes IN1 to IN4. Access environment information of different kinds may be input to different input nodes. The access environment information EI of each input node is transferred to the first to fifth hidden nodes HN1 to HN5 of the first hidden layer with weights. An input of each of the first to fifth hidden nodes HN1 to HN5 is transferred to the sixth to tenth hidden nodes HN6 to HN10 of the second hidden layer with weights. Inputs of the sixth to tenth hidden nodes HN6 to HN10 are transferred to the output node ON with weights.

Machine learning may be performed by repeatedly updating weights based on a difference between a value of the output node ON, which is obtained upon inputting the access environment information EI to the first to fourth input nodes IN1 to IN4, and the access result information AI obtained an access is practically performed.

The initial access classifier CF2 that is based on the neural network may be generated by the off-line learning and may be mounted in the storage device 100. As the user makes use of the storage device 100, the access classifier CF2 that is based on the neural network may be updated by the on-line learning.

Figure 22:
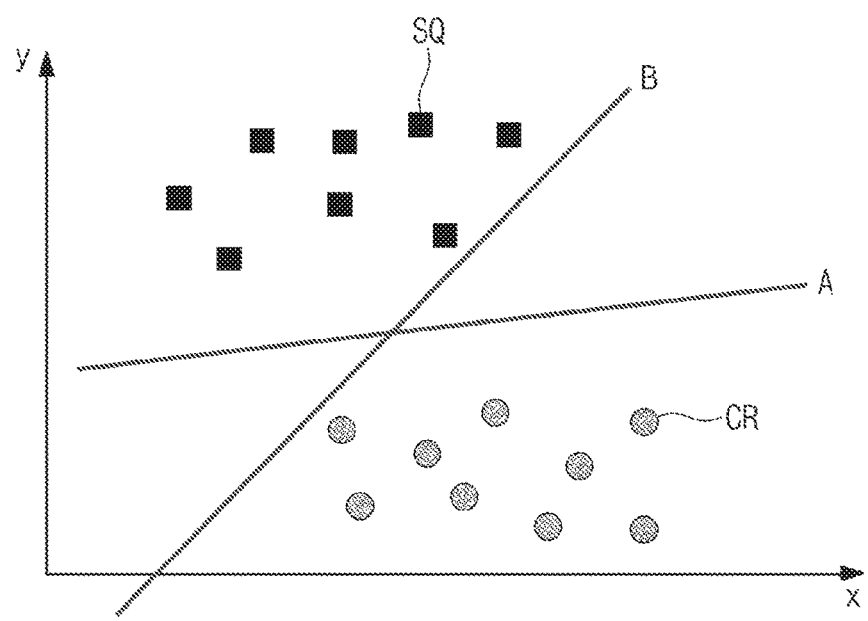
FIG. 22 shows another example of an access classifier generated by machine learning.

FIG. 22 shows another example of an access classifier CF generated by machine learning. In some example embodiments, the access classifier CF may be a support vector machine. In FIG. 22, each of the abscissa "x" and the ordinate "y" indicates the access environment information EI. Shapes (square and circle) of samples distributed in FIG. 22 indicate different access result information AI.

Referring to FIGS. 1 and 22, line A and line B may be usefully used to classify square samples SQ and circle samples CR. However, considering probability of samples that will be collected later, the margin of line A is greater than the margin of line B. The access classifier CF may select a classification criterion having a greater margin like line A.

The access classifier CF may have an initial classification criterion through off-line learning. The number of samples increases as the user makes use of the storage device 100, and the access classifier CF may update a classification criterion through on-line learning.

Figure 23:
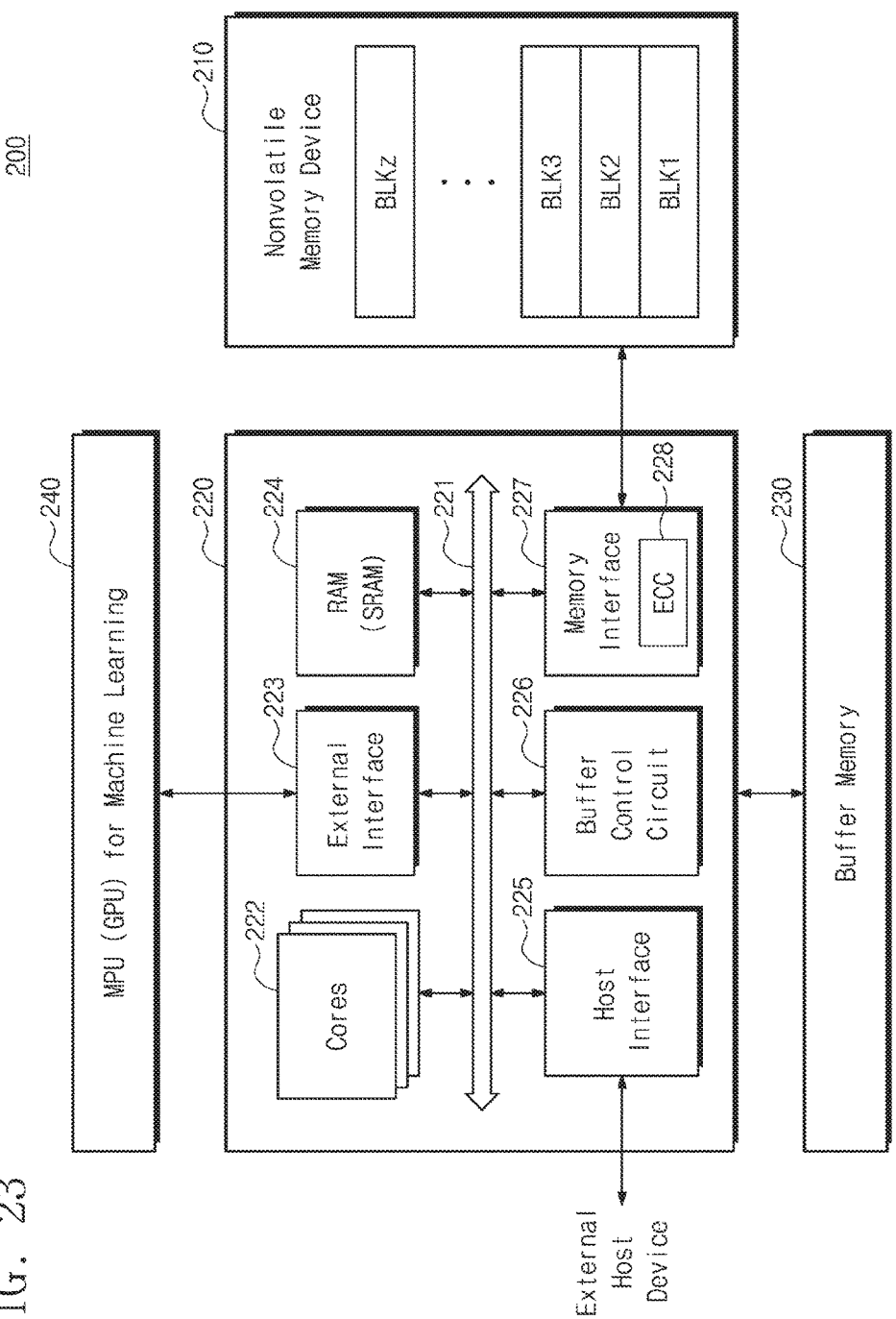
FIG. 23 is a block diagram illustrating an application of a storage device of FIG. 1.

FIG. 23 is a block diagram illustrating an application of a storage device 100. Referring to FIGS. 1 and 18, a storage device 200 includes a nonvolatile memory device 210, a controller 220, a buffer memory 230, and a processor 240 for machine learning. The processor 240 may be a microprocessor (MPU) or a graphic processor (GPU).

The controller 220 includes a bus 221, cores 222, an external interface 223, a RAM 224, a host interface 225, a buffer control circuit 226, and a memory interface 227 including an error correction block 228. The cores 222 and processor 240 may each include a hardware processor, an application specific integrated circuit (ASIC), and/or another suitable hardware processing unit, that when executing codes or commands and processing data stored in the RAM 224, configure the cores 222 and processor 240 as special-purpose processors for controlling one or more operations of the cores 222 and processor 240. Thus, the cores 222 may configure the controller 220 as a special-purpose controller for controlling one or more operations of the controller 220 discussed herein. In some example embodiments, the processor 240 may include a separate memory (not shown) such as a non-volatile or volatile memory.

The cores 222 of the controller 220 may not be used to perform machine learning. The controller 220 may include an external interface 223 for communicating with the processor 240 that is separately provided on the outside of the controller 220. The cores 222 may request the machine learning from the processor 240 through the external interface 223. Also, the cores 222 may request the classification result CR from the processor 240 through the external interface 223.

Figure 24:
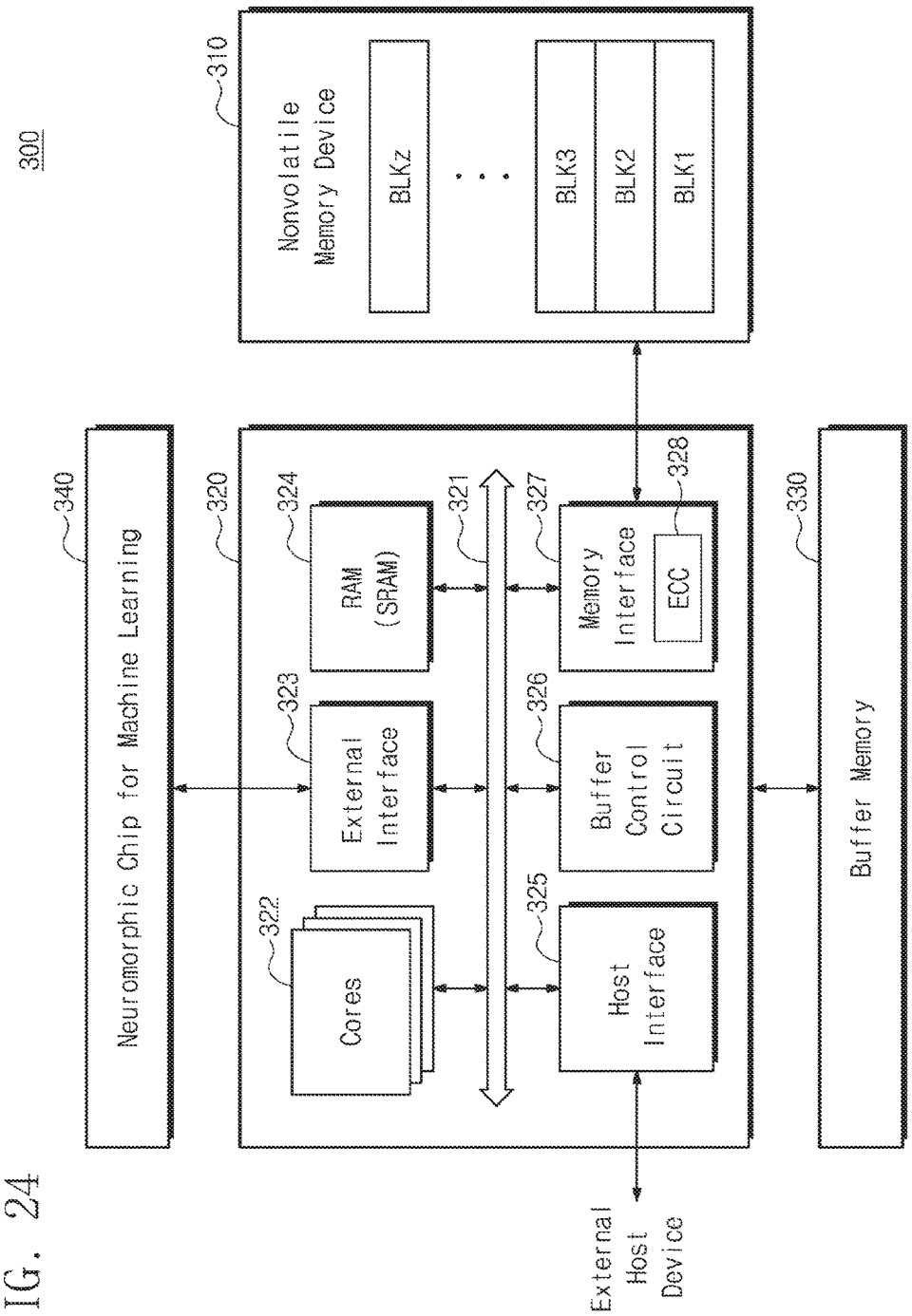
FIG. 24 is a block diagram illustrating an application of the storage device 200 of FIG. 23.

FIG. 24 is a block diagram illustrating an application of the storage device 200 of FIG. 23. Referring to FIGS. 1 and 24, a storage device 300 includes a nonvolatile memory device 310, a controller 320, a buffer memory 330, and a neuromorphic chip 340 for machine learning. The neuromorphic chip 340 is a hardware processor that emulates an operating manner of the brain to process a huge parallel operation with low power. The neuromorphic chip 340 may be used to process machine learning, as compared to other processors, by processing pieces of information described with reference to FIGS. 15 to 17 in parallel.

The controller 320 includes a bus 321, cores 322, an external interface 323, a RAM 324, a host interface 325, a buffer control circuit 326, and a memory interface 327 including an error correction block 328.

The cores 322 of the controller 320 may not be used to perform machine learning. The controller 320 may include the external interface 323 for communicating with the neuromorphic chip 340 that is separately provided on the outside of the controller 320. The cores 322 may request the machine learning from the neuromorphic chip 340 through the external interface 323. Also, the cores 322 may request the classification result CR from the neuromorphic chip 340 through the external interface 323. The cores 322 may include a hardware processor, an application specific integrated circuit (ASIC), and/or another suitable hardware processing unit, that when executing codes or commands and processing data stored in the RAM 324, respectively configure the cores 322 as a special-purpose processor for controlling one or more operations of the cores 322. Thus, the cores 322 may configure the controller 320 as a special-purpose controller for controlling one or more operations of the controller 320 discussed herein.

According to some example embodiments of inventive concepts, a method in which a controller accesses a nonvolatile memory device is adjusted according to machine learning.

Accordingly, it may be possible to provide a storage device and an access method of a nonvolatile memory device, which provide optimum operating performance to each of users to be adaptive to patterns of the users.

While some example embodiments of inventive concepts have been described, it will be apparent to those skilled in the art that various changes and modifications may be made without departing from the spirit and scope of inventive concepts. Therefore, it should be understood that the above-discussed embodiments are not limiting, but illustrative.

What is claimed is:

1. A storage device comprising:
a nonvolatile memory device;
a buffer memory;
a neuromorphic chip configured to generate an access classifier based on access result information and access environment information; and
a controller configured to perform first accesses to the nonvolatile memory device using the buffer memory, the controller being configured to collect first access result information and first access environment information of the first accesses in the buffer memory,
the controller being configured to perform a second access of the nonvolatile memory device using the buffer memory, and
the controller being configured to obtain a prediction result of access parameters associated with the second access by using access environment information associated with the second access and the access classifier.

2. The storage device of claim 1, wherein each of the first access result information and the prediction result includes at least one of a read level, a read pass level, whether to perform soft decision, and whether to schedule read reclaim.

3. The storage device of claim 1, wherein each of the first access result information and the prediction result includes at least one of a program start level, a program pass level, a program increment level, and whether to perform encoding.

4. The storage device of claim 1, wherein each of the first access result information and the prediction result includes at least one of an erase start level and an erase increment level.

5. The storage device of claim 1, wherein each of the first access result information and the prediction result includes at least one of whether to schedule garbage collection, whether to schedule wear leveling, whether to schedule a bad block process, whether to perform reliability read, and whether to perform access result information read.

6. The storage device of claim 1, wherein the first access result information includes at least one of program time, an erase time, a number of read iterations, a number of errors, a physical location, locations of bad blocks, and an error correction time.

7. The storage device of claim 1, wherein the first access result information includes at least one of a valley level, a peak level, and a slope between the valley level and the peak level.

8. The storage device of claim 1, wherein the first access result information includes at least one of a program and erase count, a read count, a time after program, a number of times that a program or erase pulse is applied, and a voltage level used during an access operation.

9. The storage device of claim 1, wherein the first access result information includes at least one of whether data is hot data, whether data is warm data, whether data is cold data, and a map data update status.

10. The storage device of claim 1, wherein the first access environment information includes at least one of temperature, humidity, and an access target.

11. The storage device of claim 10, wherein
the neuromorphic chip is configured to detects dominant feature information of first access result information and first access environment information, and
the neuromorphic chip is configured to generate the access classifier based on the dominant feature information.

12. The storage device of claim 1, wherein
the neuromorphic chip is configured to detect at least two feature information respectively dominant to at least two performances,
the neuromorphic chip is configured to select one of the at least two feature information based on a mode of performance, and
the neuromorphic chip is configured to generate the access classifier based on the selected at least two feature information.

13. The storage device of claim 12, wherein the at least two performances include a speed and a reliability.

14. The storage device of claim 12, wherein the neuromorphic chip is configured to increase a weight of selected feature information and decrease a weight of unselected feature information.

15. The storage device of claim 12, wherein the controller is configured to adjust the mode of performance.

16. The storage device of claim 1, wherein the access result information includes at least one of parameters for a read operation, parameters for a program operation, parameters for an erase operation, general physical information of the nonvolatile memory device, distribution information of threshold voltages of memory cells of the nonvolatile memory device, deterioration information of memory cells of the nonvolatile memory device, deterioration information of data written in the memory cells, and logical information associated with the nonvolatile memory device.

17. The storage device of claim 1, wherein the controller is configured to update a previous access classifier, when generating the access classifier, based on first access result information and first access environment information.

18. The storage device of claim 1, wherein the controller generates or updates the access classifier through machine learning if at least one of cases when a time period comes, when a size of the collected access result information and access environment information reaches a desired (and/or alternatively predetermined) size, when an idle time comes, when power-off is detected, and when a storage capacity of the buffer memory is insufficient.

19. A storage device comprising:
a nonvolatile memory device;
a buffer memory; and
a controller configured to perform first accesses to the nonvolatile memory device using the buffer memory, the controller being configured to collect access result information and access environment information of the first accesses in the buffer memory, and the controller being configured to generate an access classifier by performing machine learning based on the access result information and the access environment information collected in the buffer memory,
the controller being configured to perform a second access of the nonvolatile memory device using the buffer memory, and the controller being configured to obtain a prediction result of access parameters associated with the second access by using access environment information associated with the second access and the access classifier.

20. An access method of a nonvolatile memory device, the method comprising:

performing first accesses to the nonvolatile memory device to collect first access result information and first access environment information of the first accesses;

generating an access classifier, the generating the access classifier including performing machine learning based on the collected first access result information and the collected first access environment information;

obtaining, before performing a second access on the nonvolatile memory device, a prediction result of access parameters associated with the second access by using second access environment information of the second access and the access classifier;

performing the second access on the nonvolatile memory device using the prediction result; and updating the access classifier to apply second access result information of the second access and the second access environment information of the second access to the access classifier.

* * * * *